(12) United States Patent
Kim et al.

(10) Patent No.: US 12,476,185 B2
(45) Date of Patent: Nov. 18, 2025

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Joonam Kim, Suwon-si (KR); Sejun Park, Yongin-si (KR); Jaeduk Lee, Seongnam-si (KR); Gaeun Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 634 days.

(21) Appl. No.: 17/868,899

(22) Filed: Jul. 20, 2022

(65) Prior Publication Data

US 2023/0170295 A1 Jun. 1, 2023

(30) Foreign Application Priority Data

Nov. 30, 2021 (KR) .................. 10-2021-0169344

(51) Int. Cl.
*H01L 23/522* (2006.01)
*H01L 23/528* (2006.01)
(Continued)

(52) U.S. Cl.
CPC ........ *H01L 23/5226* (2013.01); *H01L 23/528* (2013.01); *H10B 41/27* (2023.02); *H10B 43/27* (2023.02)

(58) Field of Classification Search
CPC ............ H01L 23/5226; H01L 23/528; H10B 41/27; H10B 43/27; H10B 43/50; H10B 43/10; H10B 43/40; H10B 43/35
See application file for complete search history.

(56) References Cited

U.S. PATENT DOCUMENTS 6,873,007 B2 3/2005 Sugita et al.
9,257,572 B2 2/2016 Seol et al.
(Continued)

FOREIGN PATENT DOCUMENTS

JP S63-164265 A 7/1988
JP 2004-111478 A 4/2004
(Continued)

OTHER PUBLICATIONS

Korean Office Action dated May 16, 2025 for corresponding Korean Patent Application No. 10-2021-0169344 and its English-language translation.

*Primary Examiner* — Galina G Yushina
(74) *Attorney, Agent, or Firm* — HARNESS, DICKEY & PIERCE, P.L.C.

(57) ABSTRACT

A semiconductor device may include a plurality of gate electrodes apart from each other in a vertical direction on a substrate; a plurality of channel structures penetrating the plurality of gate electrodes and extending in the vertical direction; and a plurality of bit lines arranged on and connected to the plurality of channel structures. The plurality of bit lines may include a plurality of lower bit lines and a plurality of upper bit lines at different vertical levels from each other to constitute at least two layers. The plurality of upper bit lines may be apart from each other in a first horizontal direction and extend in parallel with each other in a second horizontal direction perpendicular to the first horizontal direction. A lower expansion space may be defined between two lower bit lines adjacent to each other among the plurality of lower bit lines.

20 Claims, 22 Drawing Sheets

(51) Int. Cl.
  *H10B 41/27*  (2023.01)
  *H10B 43/27*  (2023.01)

(56) References Cited

U.S. PATENT DOCUMENTS

| | | |
|---|---|---|
| 9,947,683 B2 | 4/2018 | Shimojo |
| 10,242,997 B2 | 3/2019 | Choi et al. |
| 10,403,632 B2 | 9/2019 | Ogawa et al. |
| 10,868,029 B2 | 12/2020 | Iijima et al. |
| 10,978,485 B2 | 4/2021 | Lue |
| 11,024,640 B2 | 6/2021 | Hwang et al. |
| 2015/0115345 A1 | 4/2015 | Nowak et al. |
| 2017/0077124 A1* | 3/2017 | Shimojo ............ H01L 21/76877 |
| 2018/0026049 A1* | 1/2018 | Lee ......................... H10D 1/00 |
| | | 257/324 |
| 2020/0126903 A1 | 4/2020 | Tak et al. |
| 2020/0350326 A1* | 11/2020 | Yun ........................ H10B 41/27 |
| 2021/0104538 A1 | 4/2021 | Lee et al. |
| 2022/0173028 A1* | 6/2022 | Kim ....................... H10B 43/10 |

FOREIGN PATENT DOCUMENTS

| | | |
|---|---|---|
| KR | 10-2015-0047823 A | 5/2015 |
| KR | 10-2020-0132790 A | 11/2020 |

\* cited by examiner

SEMICONDUCTOR DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2021-0169344, filed on Nov. 30, 2021 in the Korean Intellectual Property Office, the disclosure of which is incorporated by reference herein in its entirety.

BACKGROUND

Inventive concepts relate to a semiconductor device and/or an electronic system including the same, and more particularly, to a semiconductor device including a vertical channel and/or an electronic system including the same.

In an electronic system requiring a data storage, a semiconductor device capable of storing a large amount of data may be required. Accordingly, methods have been studied to increase data storage capacity of a semiconductor device. For example, as one of the methods to increase data storage capacity of a semiconductor device, a semiconductor device including three-dimensionally arranged memory cells instead of two-dimensionally arranged memory cells has been proposed.

SUMMARY

Inventive concepts provide a semiconductor device in which channel holes may be arranged at a narrow pitch to increase data storage capacity of the semiconductor device, and an electronic system including the semiconductor device.

Inventive concepts provide a semiconductor device as follows and/or an electronic system including the same.

According to an embodiment of inventive concepts, a semiconductor device may include a plurality of gate electrodes apart from each other in a vertical direction on a substrate; a plurality of channel structures penetrating the plurality of gate electrodes and extending in the vertical direction; and a plurality of bit lines arranged on the plurality of channel structures and connected to the plurality of channel structures. The plurality of bit lines may include a plurality of lower bit lines and a plurality of upper bit lines at different vertical levels from each other to constitute at least two layers. The plurality of upper bit lines may be spaced apart from each other in a first horizontal direction and extend parallel with each other in a second horizontal direction. The second horizontal direction may be perpendicular to the first horizontal direction. Each of the plurality of lower bit lines may include a first lower segment extending in the second horizontal direction, a second lower segment apart from the first lower segment in the first horizontal direction and extending in the second horizontal direction, and a first lower bending portion connecting the first lower segment to the second lower segment. The first lower bending portion may extend at an inclination angle with respect to the second horizontal direction. Two adjacent lower bit lines, among the plurality of lower bit lines, may define a lower expansion space between the first lower bending portion of a first one of the two adjacent lower bit lines and the first lower bending portion of a second one of the two adjacent lower bit lines.

According to an embodiment of inventive concepts, a semiconductor device may include a gate stack on a substrate. The gate stack may include a plurality of gate electrodes spaced apart from each other in a vertical direction on the substrate, a plurality of channel structures penetrating the plurality of gate electrodes and extending in the vertical direction, a pair of gate stack separation openings penetrating the plurality of gate electrodes and extending in a first horizontal direction, a string selection line cut region penetrating at least one gate electrode, a plurality of bit lines respectively arranged on the plurality of channel structures, and a plurality of bit line contacts between the plurality of channel structures and the plurality of bit lines. The at least one gate electrode may include an uppermost gate electrode among the plurality of gate electrodes, and the string selection line cut region may extend in the first horizontal direction between the pair of gate stack separation openings. The plurality of bit lines may include a plurality of lower bit lines and a plurality of upper bit lines at different vertical levels from each other to constitute at least two layers. Each of the plurality of lower bit lines may include a first lower segment extending in a second horizontal direction, a second lower segment apart from the first lower segment in the first horizontal direction and extending in the second horizontal direction, and a first lower bending portion connecting the first lower segment to the second lower segment and extending at an inclination angle with respect to the second horizontal direction. Two adjacent lower bit lines, among the plurality of lower bit lines, may define a first lower expansion space between the first lower bending portion of a first one of the two adjacent lower bit lines and the first lower bending portion of a second one of the two adjacent lower bit lines. The plurality of upper bit lines may extend parallel with each other in the second horizontal direction. The second horizontal direction may be perpendicular to the first horizontal direction. The plurality of bit line contacts may include a plurality of lower bit line contacts connected to the plurality of lower bit lines and a plurality of upper bit line contacts connected to the plurality of upper bit lines. At least some of the plurality of upper bit line contacts may connect at least some of the plurality of channel structures to at least some of the plurality of upper bit lines via the first lower expansion space.

According to an embodiment of inventive concepts, an electronic system may include a main substrate; a semiconductor device on the main substrate; and a controller electrically connected to the semiconductor device on the main substrate. The semiconductor device may include a plurality of gate electrodes, a plurality of channel structures, a plurality of bit lines arranged on and connected to the plurality of channel structures, a periphery circuit electrically connected to the plurality of gate electrodes and the plurality of bit lines, and an input/output pad electrically connected to the periphery circuit. The plurality of gate electrodes may be apart from each other in a vertical direction on the main substrate. The plurality of channel structures may penetrate the plurality of gate electrodes and extend in the vertical direction. The plurality of bit lines may include a plurality of lower bit lines and a plurality of upper bit lines at different vertical levels from each other to constitute at least two layers. The plurality of upper bit lines may be apart from each other in a first horizontal direction and extend in parallel with each other in a second horizontal direction. The second horizontal direction may be perpendicular to the first horizontal direction. Each of the plurality of lower bit lines may include a first lower segment extending in the second horizontal direction, a second lower segment apart from the first lower segment in the first horizontal direction and extending in the second horizontal direction, and a first lower bending portion connecting the first lower segment to the second lower segment. The first lower bending portion may extend at an inclination angle with respect to the second horizontal direction. Two adjacent lower bit lines, among the plurality of lower bit lines, may define a lower expansion space between the first lower bending portion of a first one of the two adjacent lower bit lines and the first lower bending portion of a second one of the two adjacent lower bit lines.

BRIEF DESCRIPTION OF THE DRAWINGS

Embodiments of inventive concepts will be more clearly understood from the following detailed description taken in conjunction with the accompanying drawings in which:

FIG. 13 is an enlarged cross-sectional view of region CX4 in FIG. 12;

DETAILED DESCRIPTION

Figure 1:
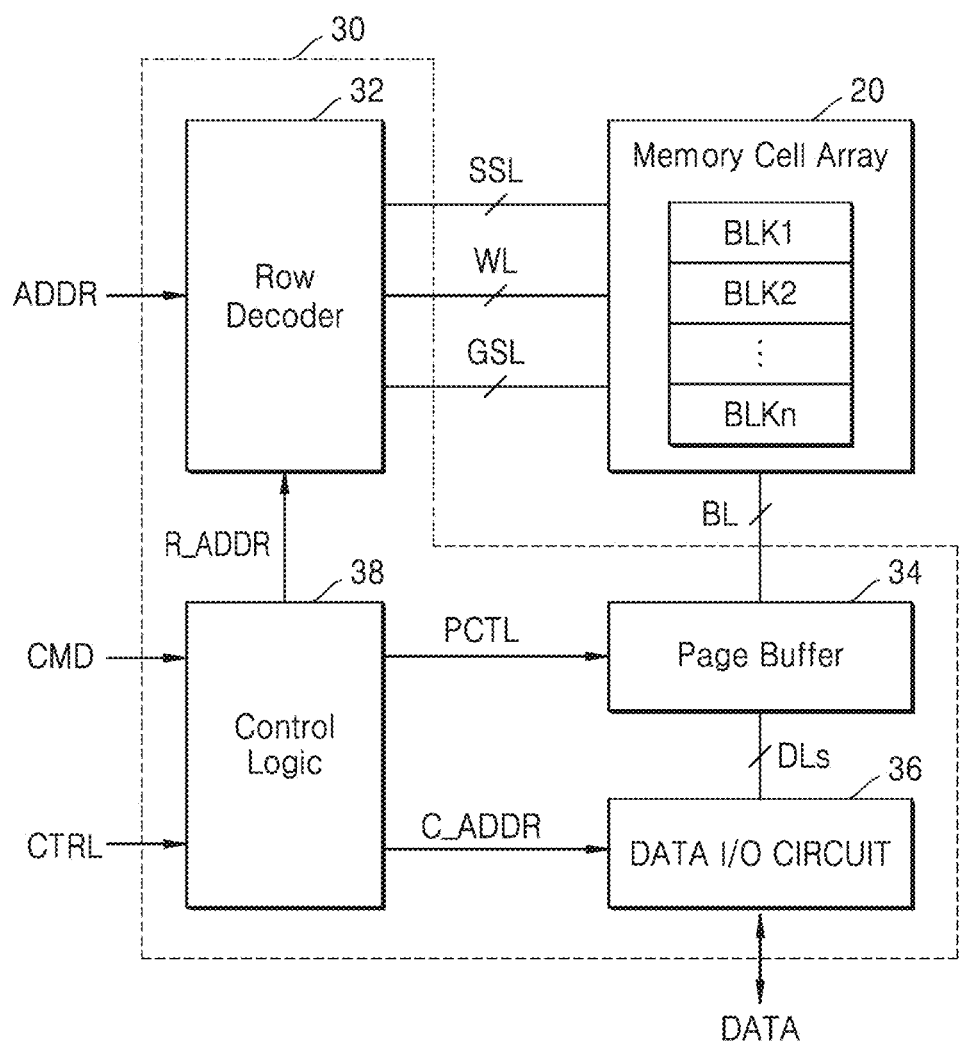
FIG. 1 is a block diagram of a semiconductor device according to an example embodiment.

FIG. 1 is a block diagram of a semiconductor device 10 according to an example embodiment.

Referring to FIG. 1, the semiconductor device 10 may include a memory cell array 20 and a periphery circuit 30. The memory cell array 20 may include a plurality of memory cell blocks BLK1, BLK2, . . . , BLKn. Each of the plurality of memory cell blocks BLK1, BLK2, . . . , BLKn may include a plurality of memory cells. The plurality of memory cell blocks BLK1, BLK2, . . . , BLKn may be connected to the periphery circuit 30 via a bit line BL, a word line WL, a string selection line SSL, and a ground selection line GSL.

The periphery circuit 30 may include a row decoder 32, a page buffer 34, a data input/output (I/O) circuit 36, and a control logic 38. The periphery circuit 30 may further include an I/O interface, a column logic, a voltage generator, a pre-decoder, a temperature sensor, a command decoder, an address decoder, an amplification circuit, etc.

The memory cell array 20 may be connected to the page buffer 34 via the bit line BL, and may be connected to the row decoder 32 via the word line WL, the string selection line SSL, and the ground selection line GSL. In the memory cell array 20, each of the plurality of memory cells included in each of the plurality of memory cell blocks BLK1, BLK2, . . . , BLKn may include a flash memory cell. The memory cell array 20 may include a three-dimensional memory cell array. The three-dimensional memory cell array may include a plurality of NAND strings, and each NAND string may include a plurality of memory cells respectively connected to the plurality of word lines WL, which are vertically stacked on a substrate.

The periphery circuit 30 may receive an address ADDR, a command CMD, and a control signal CTRL from the outside of the semiconductor device 10, and may transceive data DATA to/from a device outside the semiconductor device 10.

The row decoder 32 may select at least one of the plurality of memory cell blocks BLK1, BLK2, . . . , BLKn in response to the address ADDR from the outside of the memory device 10, and may select the word line WL, the string selection line SSL, and the ground selection line GSL of the selected memory cell block. The row decoder 32 may transmit a voltage for performing a memory operation to the word line WL of the selected memory cell block.

The page buffer 34 may be connected to the memory cell array 20 via the bit line BL. The page buffer 34 may act as a write driver during a program operation to apply, to the bit line BL, a voltage according to the data DATA to be stored in the memory cell array 20, and may operate as a sensing amplifier during a read operation to detect the data DATA stored in the memory cell array 20. The page buffer 34 may operate according to a control signal PCTL provided by the control logic 38.

The data I/O circuit 36 may be connected to the page buffer 34 via data lines DL. The data I/O circuit 36 may receive the data DATA from a memory controller (not illustrated) during the program operation, and provide program data DATA to the page buffer 34 based on a column address C_ADDR provided by the control logic 38. The data I/O circuit 36 may provide the memory controller with read data DATA stored in the page buffer 34 based on the column address C_ADDR provided by the control logic 38 during the read operation.

The data I/O circuit 36 may transmit an address or a command, which is input, to the control logic 38 or the row decoder 32. The periphery circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32, and provide the column address C_ADDR to the data I/O circuit 36. The control logic 38 may generate various internal control signals to be used by the semiconductor device 10 in response to the control signal CTRL. For example, the control logic 38 may control a voltage level provided to the word line WL and the bit line BL when memory operations, such as a program operation and an erase operation are performed.

Figure 2:
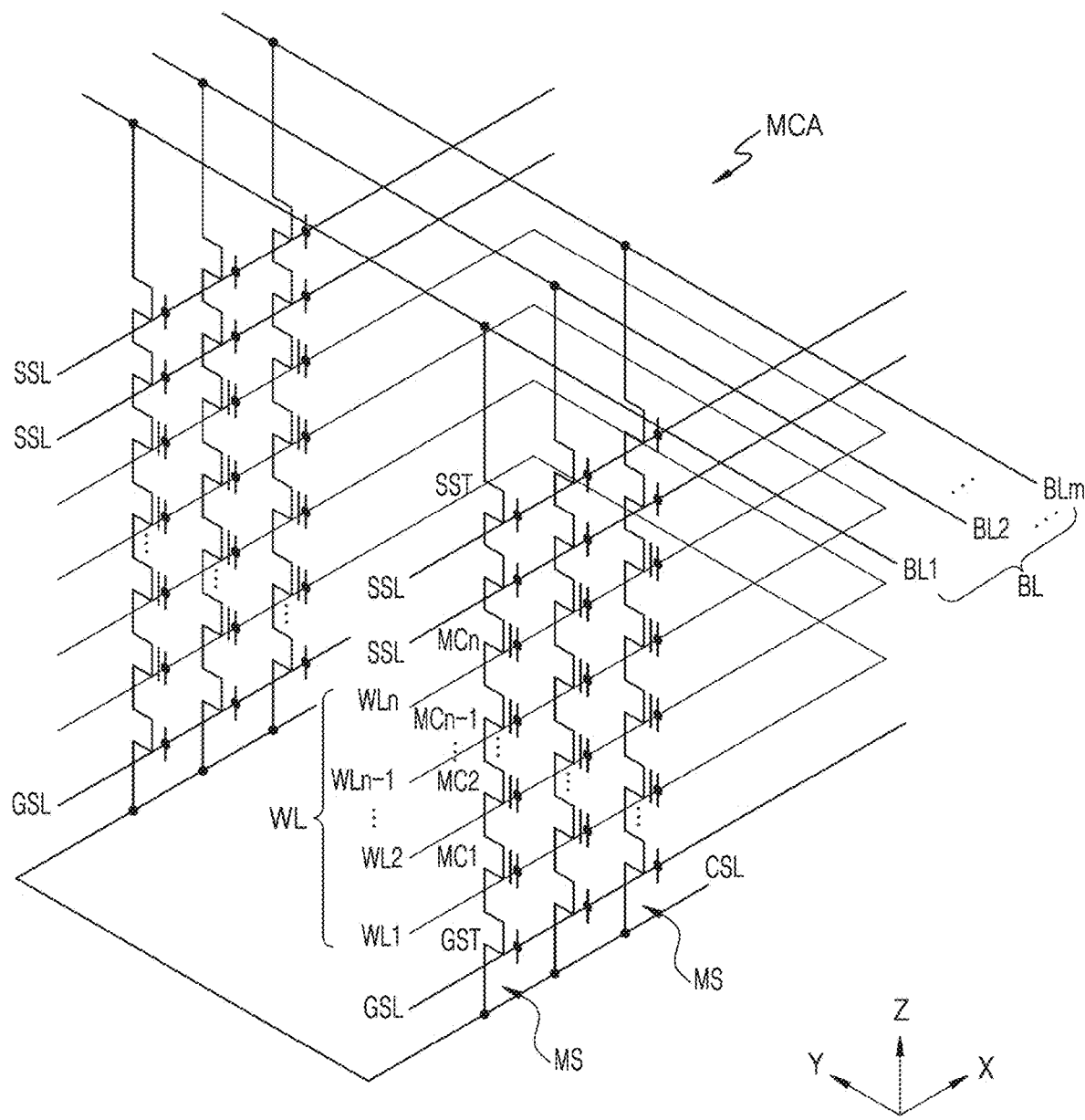
FIG. 2 is an equivalent circuit diagram of a memory cell array of a semiconductor device, according to an example embodiment.

FIG. 2 is an equivalent circuit diagram of a memory cell array MCA of a semiconductor device, according to an example embodiment.

Referring to FIG. 2, the memory cell array MCA may include a plurality of memory cell strings MS. The memory cell array MCA may include a plurality of bit lines BL1, BL2, ..., BLm, a plurality of word lines WL1, WL2, ..., WLn−1, WLn, at least one string selection line SSL, at least one ground selection line GSL, and a common source line CSL. The plurality of memory cell strings MS may be formed between the plurality of bit lines BL1, BL2, ..., BLm and the common source line CSL. FIG. 2 illustrates the case, in which each of the plurality of memory cell strings MS includes two string selection lines SSL, but example embodiments are not limited thereto. For example, each of the plurality of memory cell strings MS may also include one string selection line SSL.

Each of the plurality of memory cell strings MS may include a string selection transistor SST, a ground selection transistor GST, and a plurality of memory cell transistors MC1, MC2, ..., MCn−1, MCn. A drain region of the string selection transistor SST may be connected to the plurality of bit lines BL1, BL2, ..., BLm, and a source region of the ground selection transistor GST may be connected to the common source line CSL. The common source line CSL may be a region, to which the source region of the plurality of ground selection transistors GST are connected in common.

The string selection transistor SST may be connected to the string selection line SSL, and the ground selection transistor GST may be connected to the ground selection line GSL. The plurality of memory cell transistors MC1, MC2, ..., MCn−1, MCn may be connected to the plurality of word lines WL1, WL2, ..., WLn−1, WLn, respectively.

Figure 3:
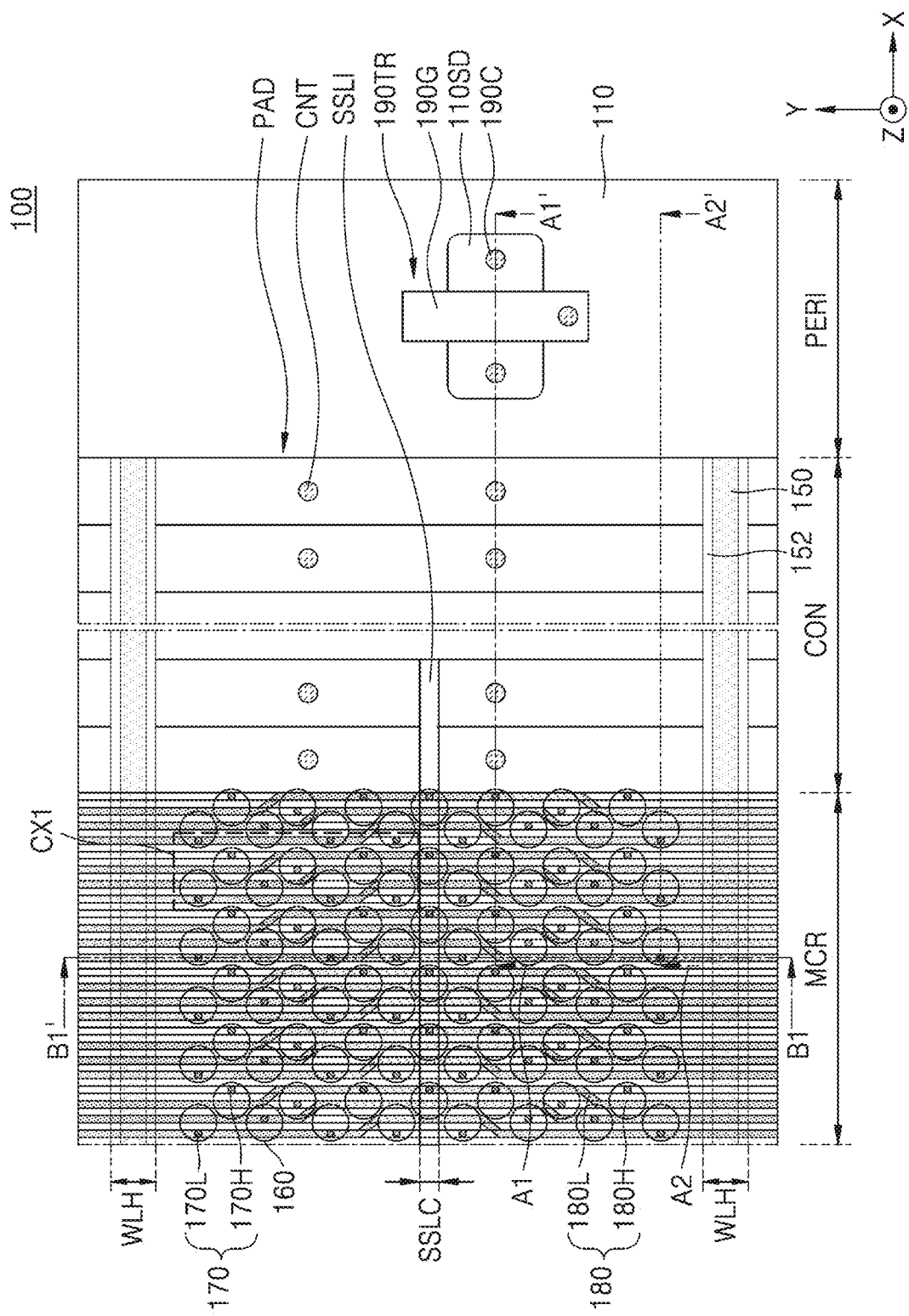
FIGS. 3 through 7B are drawings for explaining a semiconductor device according to example embodiments.
Figure 4A:
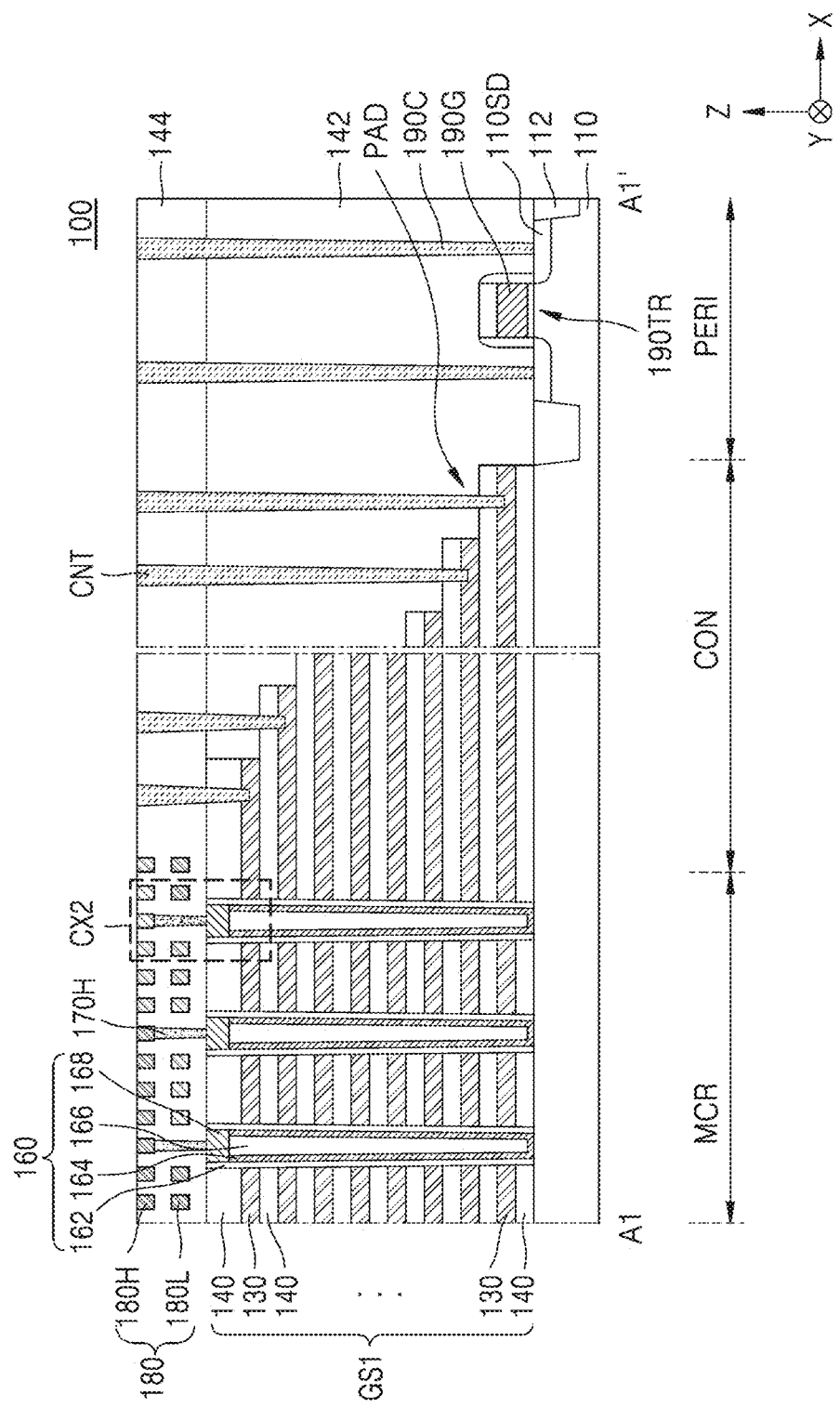
Figure 4B:
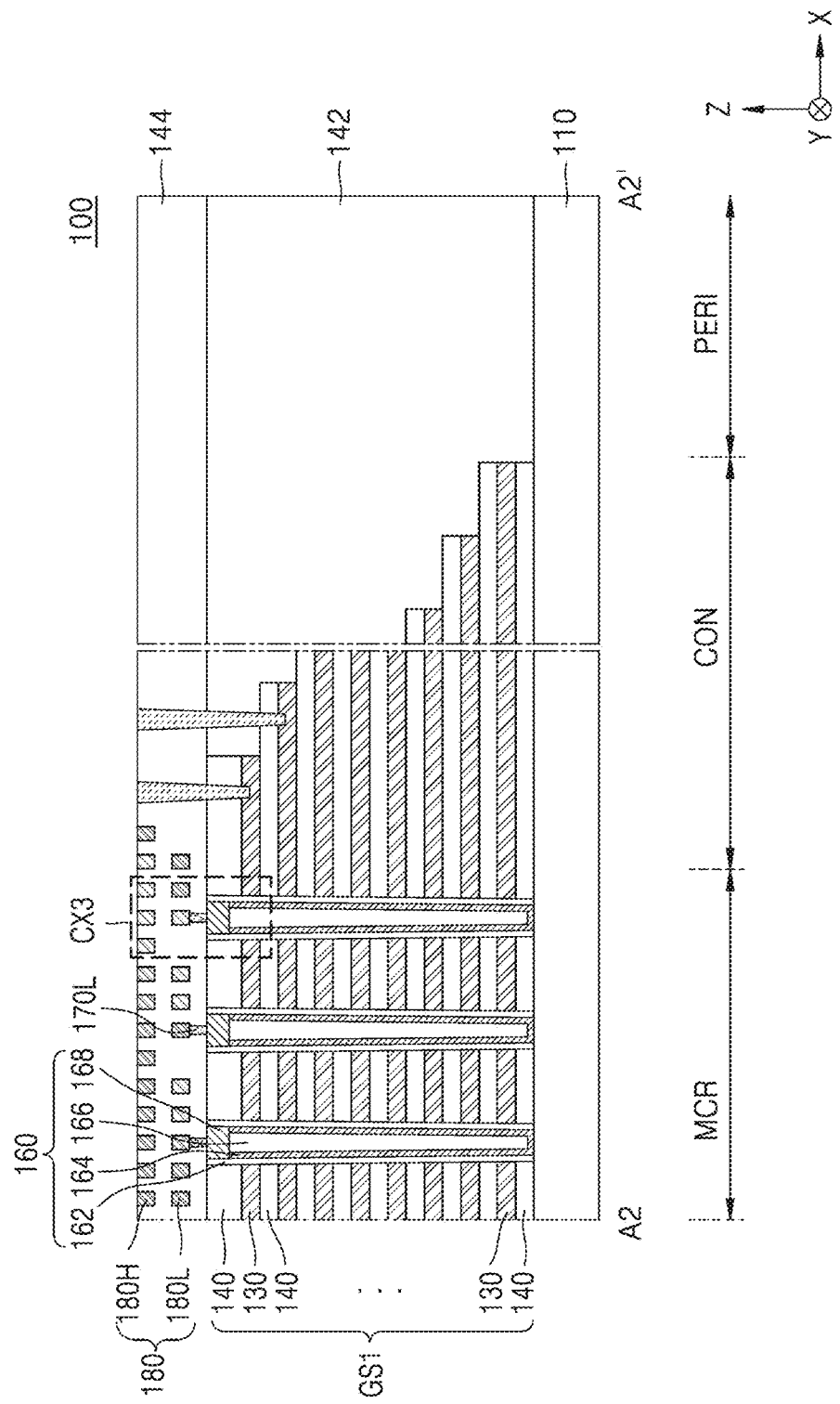
Figure 5:
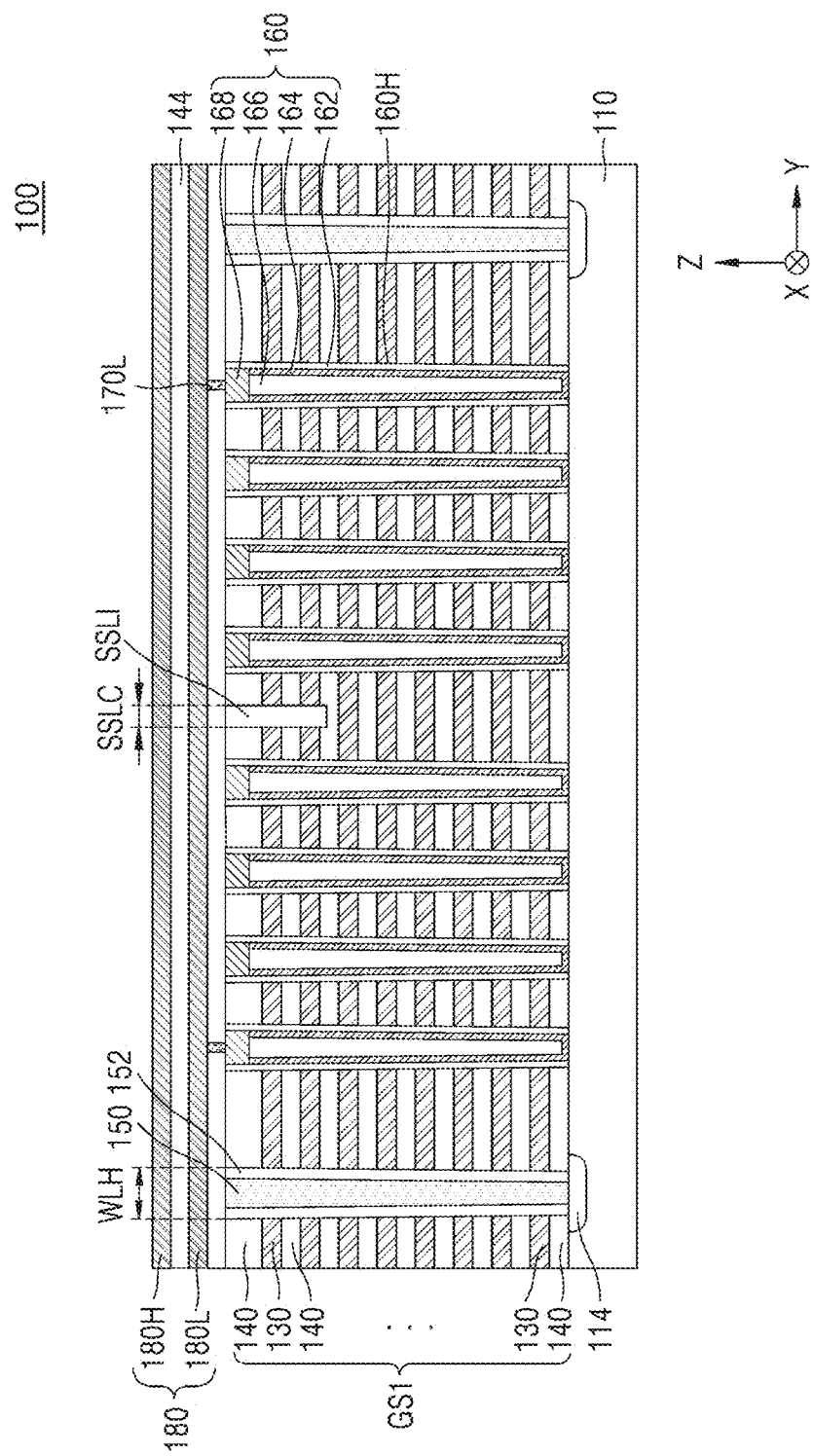
Figure 6A:
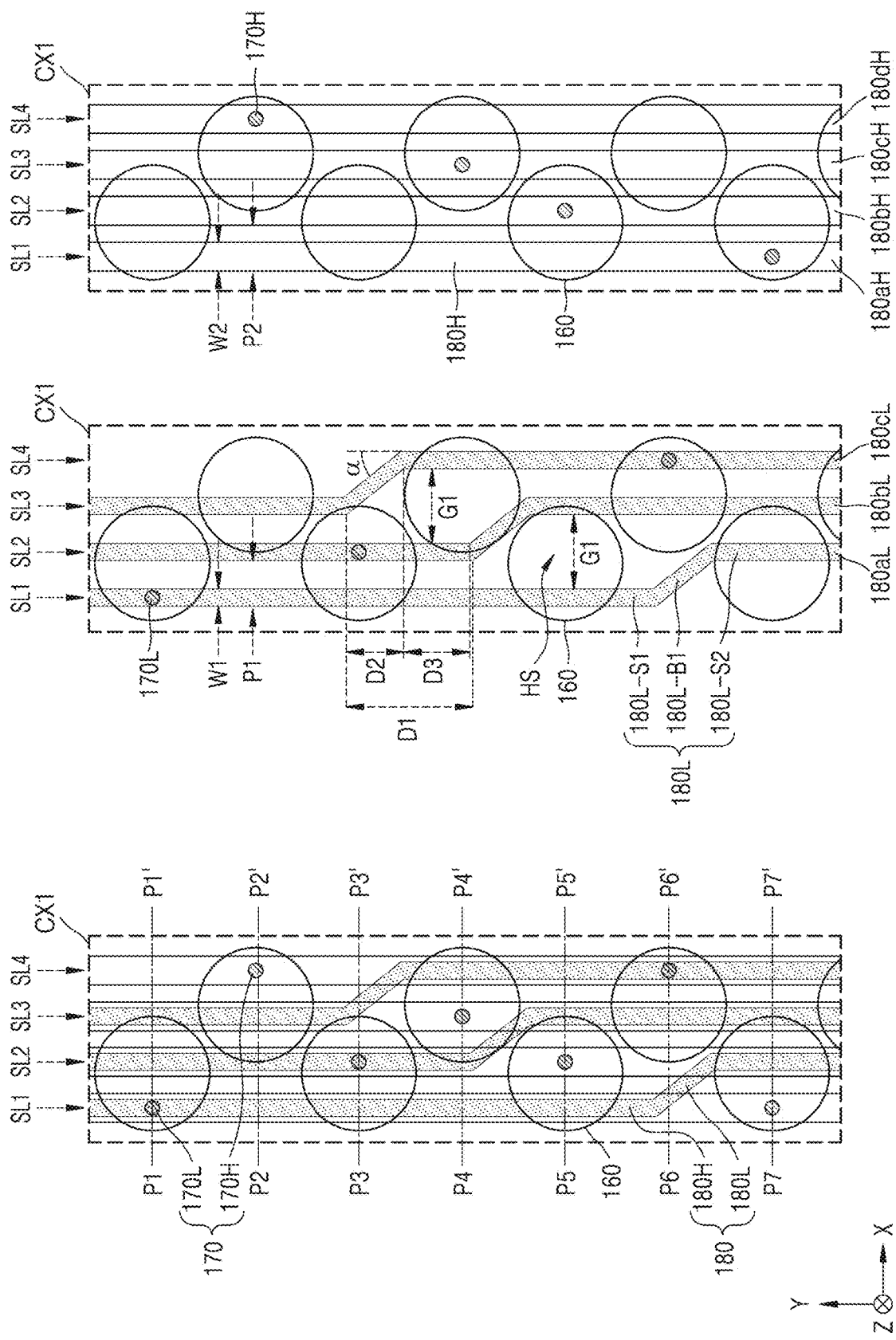
Figure 6B:
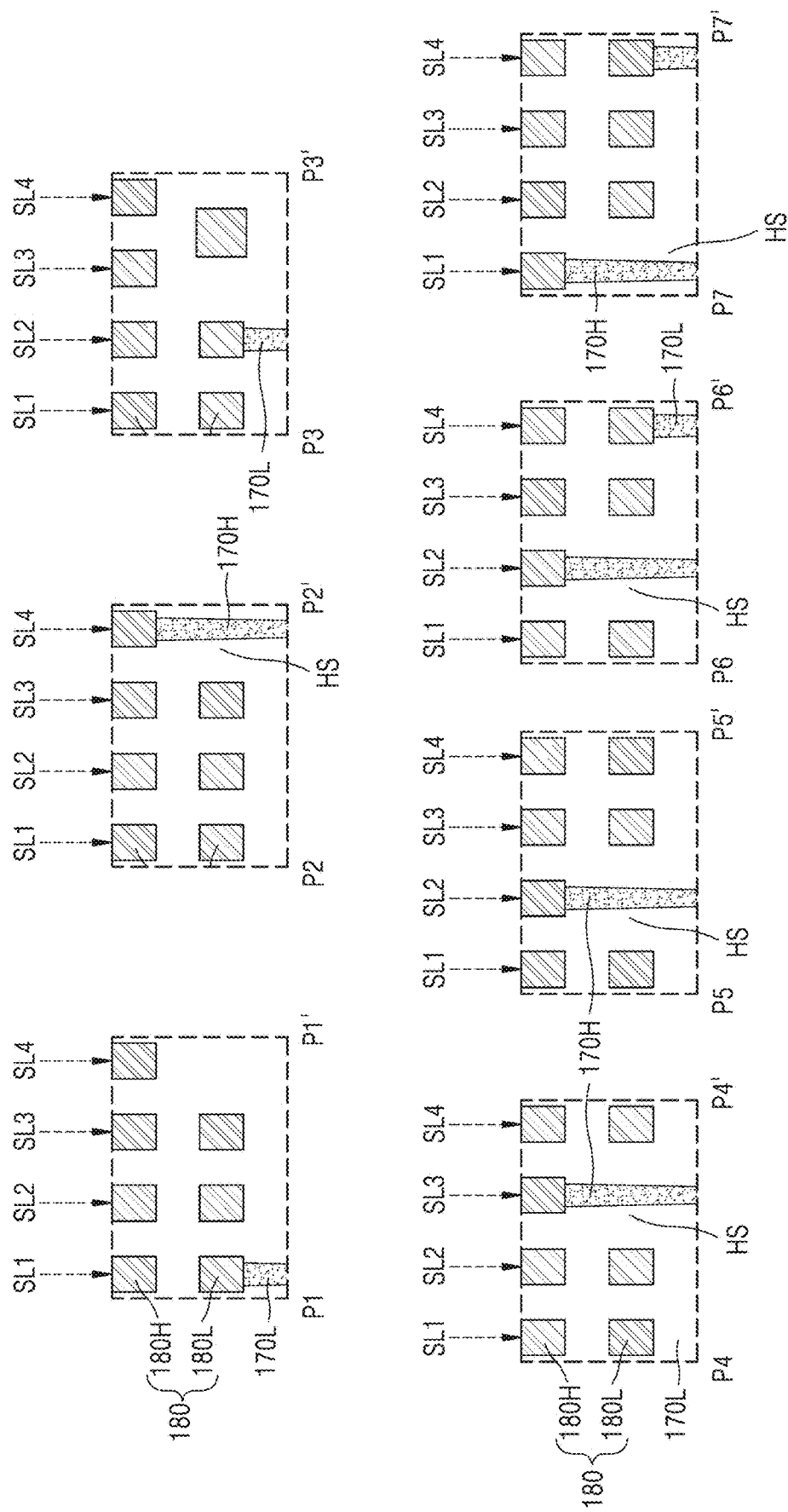
Figure 7A:
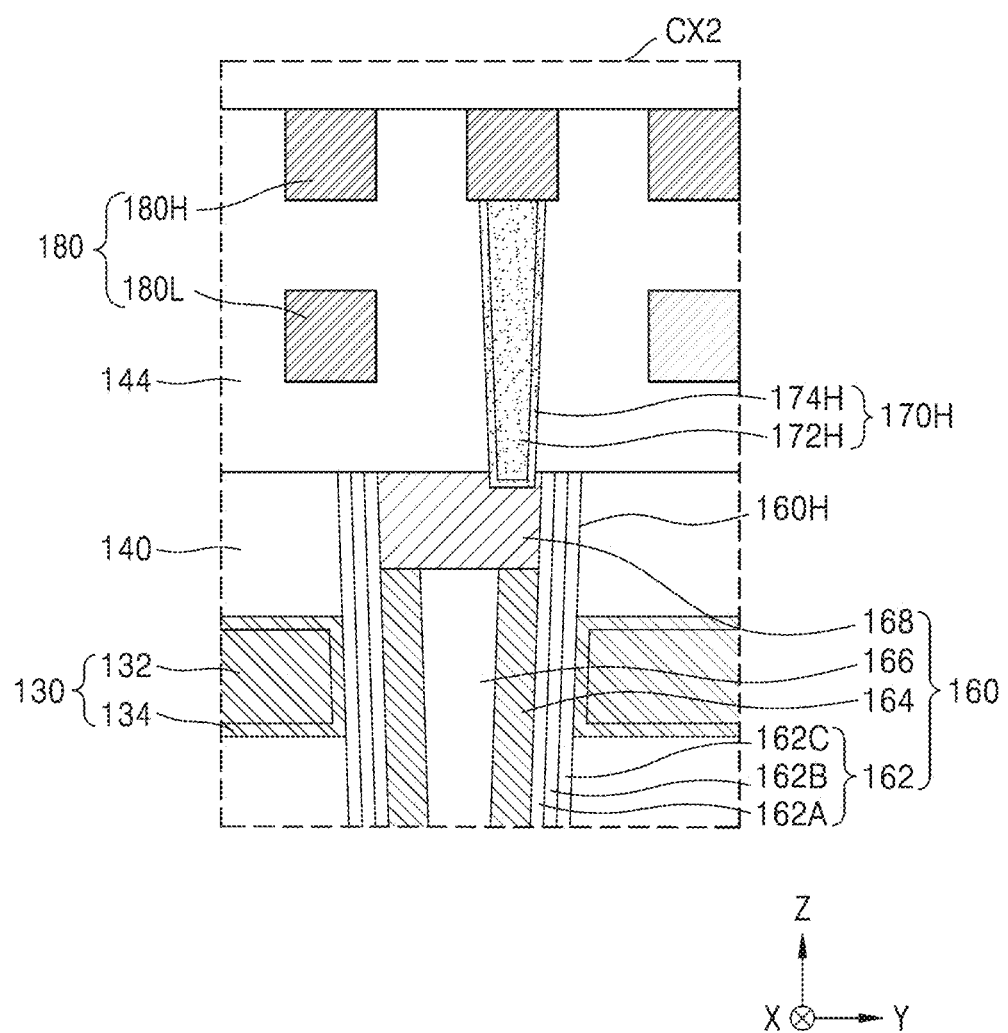
Figure 7B:
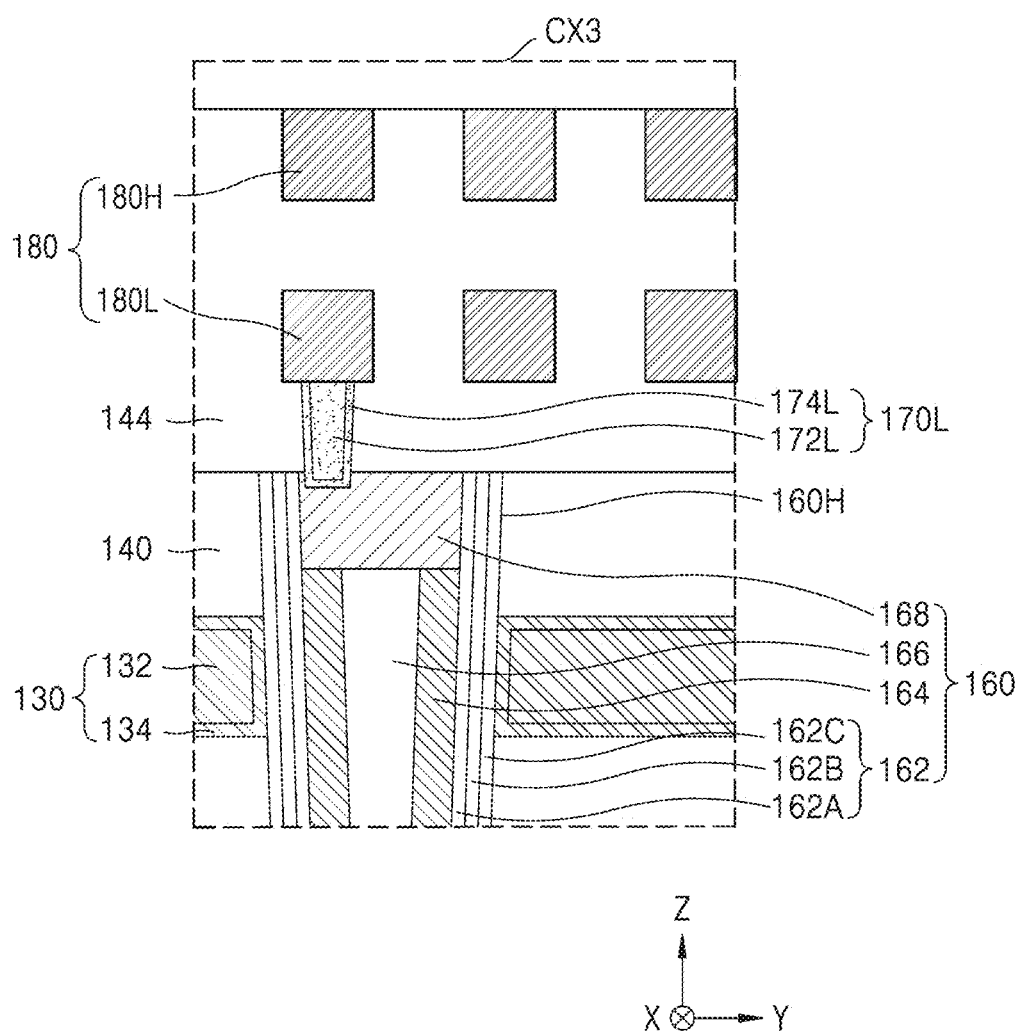

FIGS. 3 through 7B are diagrams of a semiconductor device 100 according to example embodiments. FIG. 3 is a plan view of a representative configuration of the semiconductor device 100 according to an example embodiment, FIGS. 4A and 4B are cross-sectional views taken along lines A1-A1' and A2-A2' in FIG. 3, respectively, FIG. 5 is a cross-sectional view taken along line B1-B1' in FIG. 3, FIG. 6A illustrates enlarged views of region CX1 in FIG. 3, FIG. 6B illustrates cross-sectional views of portions of cross-sections taken along lines P1-P1', P2-P2', P3-P3', P4-P4', P5-P5', P6-P6', and P7-P7' in FIG. 6A, respectively, FIG. 7A is an enlarged cross-sectional view of region CX2 in FIG. 4A, and FIG. 7B is an enlarged cross-sectional view of region CX3 in FIG. 4B.

Referring to FIGS. 3 through 7B, the semiconductor device 100 may include a memory cell region MCR, a connection region CON, and a periphery circuit region PERI, which are horizontally arranged on a substrate 110. The memory cell region MCR may include an area, in which the memory cell array MCA driven by a method described with reference to FIG. 2 and of a vertical channel structure NAND type is formed. The connection region CON may include an area, in which a pad structure PAD for electrically connecting the memory cell array MCA formed in the memory cell region MCR to the periphery circuit region PERI is formed.

In the periphery circuit region PERI, a periphery circuit transistor 190TR and a periphery circuit contact 190C may be arranged on the substrate 110. An active region AC may be defined by an element separation layer 112 in the substrate 110, and the periphery circuit transistor 190TR may be arranged in the active region AC. Although one periphery circuit transistor 190TR is illustrated in FIG. 3, this is only an example, and the semiconductor device 100 may include a plurality of periphery circuit transistors 190TR formed in the active region AC. The periphery circuit transistor 190TR may include a periphery circuit gate 190G and a source/drain region 110SD arranged in a portion of the substrate 110 on both sides of the periphery circuit gate 190G. A plurality of periphery circuit contacts 190C may be arranged on the periphery circuit gate 190G and the source/drain region 110SD. For example, some of the plurality of periphery circuit contacts 190C may be connected to the periphery circuit gate 190G, and the others thereof may be connected to the source/drain region 110SD.

The substrate 110 may include a semiconductor material such as a Group IV semiconductor material, a Group III-V semiconductor material, and a Group II-VI semiconductor material. The Group IV semiconductor material may include, for example, silicon (Si), germanium (Ge), or Si—Ge. The Group III-V semiconductor material may include, for example, gallium arsenide (GaAs), indium phosphor (InP), GaP, InAs, indium antimony InSb, or InGaAs. The Group II-VI semiconductor material may include, for example, zinc telluride (ZnTe), or cadmium sulfide (CdS). In some embodiment, the substrate 110 may include a bulk wafer or an epitaxial layer. In other embodiments, the substrate 110 may include a silicon-on-insulator (SOI) substrate or a germanium-on-insulator (GeOI) substrate.

On the substrate 110, a first gate stack GS1 may extend in a first horizontal direction (X direction) in parallel with an upper surface of the substrate 110, and extend in a second horizontal direction (Y direction) perpendicular to the first horizontal direction (X direction). The first gate stack GS1 may include a plurality of first gate electrodes 130 and a plurality of first insulation layers 140, and the plurality of first gate electrodes 130 and the plurality of first insulation layers 140 may be alternately arranged with each other in a vertical direction (Z direction) perpendicular to the upper surface of the substrate 110.

As an example, as illustrated in FIGS. 7A and 7B, the first gate electrode 130 may include a filled conductive layer 132 and a conductive barrier layer 134, which surrounds an upper surface, a bottom surface, and side surfaces of the filled conductive layer 132. For example, the filled conductive layer 132 may include a metal, such as tungsten, nickel, cobalt, and tantalum, a metal silicide, such as tungsten silicide, nickel silicide, cobalt silicide, and tantalum silicide, and polysilicon doped with impurities, or a combination thereof. For example, the conductive barrier layer 134 may include titanium nitride, tantalum nitride, tungsten nitride, or a combination thereof. In some embodiments, a dielectric liner (not illustrated) may be further arranged between the conductive barrier layer 134 and the first insulation layer 140. For example, the dielectric liner may include a high-k material such as aluminum oxide.

The plurality of first gate electrodes 130 may correspond to the ground selection line GSL constituting the memory cell string MS (refer to FIG. 2), the plurality of word lines WL1, WL2, ..., WLn−1, WLn, and at least one string selection line SSL. For example, the first gate electrode 130 at the lowermost position may function as the ground selection line GSL, at least one first electrode 130 at the uppermost position may function as the string selection line SSL, and the other first gate electrodes 130 may function as the word line WL. Accordingly, the memory cell string MS may be provided where the ground selection transistor GST, a string selection transistor SST, and the plurality of memory cell transistors MC1, MC2, ..., MCn−1, and MCn therebetween are connected in series. In some embodiments, two first gate electrodes 130 at the uppermost position may function as the string selection lines SSL, but example embodiments are not limited thereto. For example, only one first gate electrode 130 at the uppermost position may function as the string selection line SSL. In some embodiments, at least one first gate electrode 130 may also function as a dummy word line, but is not limited thereto.

As an example, as illustrated in FIG. 3, a plurality of gate stack separation openings WLH penetrating the plurality of first gate electrodes 130 may extend in the first horizontal direction (X direction) in parallel with the upper surface of the substrate 110. The first gate stack GS1 arranged between a pair of gate stack separation openings WLH may constitute one block, and the pair of gate stack separation openings WLH may define a second horizontal direction (Y direction) width of the first gate stack GS1.

On the substrate 110, a common source line 150 filling the inside of the gate stack separation opening WLH, and a gate stack separation insulation layer 152 arranged on both sidewalls of the common source line 150 may be arranged. A common source region 114 may be further formed in a portion of the substrate 110 vertically overlapping the gate stack separation opening WLH, and thus, the common source line 150 may be electrically connected to the common source region 114. In some embodiments, the common source region 114 may include an impurities region doped with n-type impurities at a high concentration, and may function as a source region for providing a current to the plurality of memory cells.

For example, the gate stack separation insulation layer 152 may include silicon oxide, silicon nitride, silicon oxynitride, or a low-k material. The gate stack separation insulating layer 152 may include silicon oxide, silicon nitride, silicon oxynitride (SiON), silicon oxycarbide nitride (SiOCN), silicon carbide nitride (SiCN), or a combination thereof.

A plurality of channel structures 160 may extend in the vertical direction (Z direction) penetrating the first gate stack GS1 from the upper surface of the substrate 110 in the memory cell region MCR. The plurality of channel structures 160 may be arranged apart from each other at a certain interval in the first horizontal direction (X direction), the second horizontal direction (Y direction), and a third horizontal direction (for example, a diagonal direction). The plurality of channel structures 160 may be arranged in a zigzag form or a staggered form.

Each of the plurality of channel structures 160 may be arranged in a channel hole 160H. Each of the plurality of channel structures 160 may include a gate insulating layer 162, a channel layer 164, a filled insulating layer 166, and a conductive plug 168. The gate insulating layer 162 and the channel layer 164 may be sequentially arranged on sidewalls of the channel hole 160H. For example, the gate insulating layer 162 may be conformally arranged on the sidewalls of the channel hole 160H, and the channel layer 164 may be conformally arranged on the sidewalls and a bottom portion of the channel hole 160H. The conductive plug 168 contacting the channel layer 164 and blocking an inlet of the channel hole 160H may be arranged on an upper side of the channel hole 160H. In some embodiments, the filled insulating layer 166 filling a portion of the channel hole 160H may be arranged on the channel layer 164, and the conductive plug 168 may contact the channel layer 164 and the filled insulating layer 166, and fill an upper side portion of the channel hole 160H. For example, the filled insulating layer 166 may fill a space defined by the channel layer 164 in the channel hole 160H. In other embodiments, the filled insulating layer 166 may be omitted, and the channel layer 164 may also be formed in a pillar shape filling the remaining portion of the channel hole 160H.

In example embodiments, the channel layer 164 may be arranged to contact the upper surface of the substrate 110 at the bottom portion of the channel hole 160H. Unlike this case, a contact semiconductor layer (not illustrated) having a certain height may be further formed on the substrate 110 at the bottom portion of the channel hole 160H, and the channel layer 164 may also be electrically connected to the substrate 110 via the contact semiconductor layer. For example, the contact semiconductor layer may include a silicon layer formed by using a selective epitaxy growth (SEG) process using the substrate 110 arranged at the bottom portion of the channel hole 160H as a seed layer. In some embodiments, unlike as illustrated in FIG. 4A, a bottom surface of the channel layer 164 may also be arranged at a lower vertical level than the upper surface of the substrate 110.

As an example, as illustrated in FIGS. 7A and 7B, the gate insulating layer 162 may have a structure including a tunneling dielectric layer 162A, a charge storing layer 162B, and a blocking dielectric layer 162C, which are sequentially arranged on outside walls of the channel layer 164. Relative thicknesses of the tunneling dielectric layer 162A, the charge storing layer 162B, and the blocking dielectric layer 162C, which constitute the gate insulating layer 162, may not be limited to those illustrated in FIGS. 7A and 7B, and may be variously modified.

For example, the tunneling dielectric layer 162A may include silicon oxide, hafnium oxide, aluminum oxide, zirconium oxide, tantalum oxide, etc. The charge storing layer 162B may, as an area, in which electrons having passed through the tunneling dielectric layer 162A from the channel layer 164 are stored, include silicon nitride, boron nitride, silicon boron nitride, or polysilicon doped with impurities. For example, the blocking dielectric layer 162C may include silicon oxide, silicon nitride, or metal oxide having a higher permittivity than silicon oxide. The metal oxide may include hafnium oxide, aluminum oxide, zirconium oxide, tantalum oxide, or a combination thereof.

In one block, at least one first gate electrode 130 that is uppermost may be horizontally separated into two portions by a string selection line cut region SSLC. The string selection line cut region SSLC may penetrate the at least one first gate electrode 130 that is uppermost, and extend in the first horizontal direction (X direction). In some embodiments, each of two first gate electrodes 130 that are uppermost may be horizontally separated into two portions by the string selection line cut region SSLC, but example embodiments are not limited thereto. For example, only one first gate electrode 130 that is uppermost may be horizontally separated into two portions by the string selection line cut region SSLC. A string separation insulating layer SSLI may be arranged in the string selection line cut region SSLC, and these two members may be arranged apart from each other with the string separation insulating layer SSLI therebetween in the second horizontal direction (Y direction). The two members may constitute the string selection lines SSL described with reference to FIG. 2.

The first gate stack GS1 may extend from the memory cell region MCR to the connection region CON, and constitute the pad structure PAD in the connection region CON. In the connection region CON, away from the upper surface of the substrate 110, the plurality of first gate electrodes 130 may extend to have shorter lengths in the first horizontal direction (X direction). The pad structure PAD may be referred to as portions of the first gate electrodes 130 arranged in a step shape in the connection region CON. A cover insulating layer 142 may be arranged on a portion of the first gate stack GS1 constituting the pad structure PAD. An upper insulating layer 144 may be arranged on the first gate stack GS1 and the cover insulating layer 142.

Although not illustrated, in the connection region CON, a plurality of dummy channel structures (not illustrated), which penetrate the first gate stack GS1 from the upper surface of the substrate 110 and extend in the vertical direction (Z direction), may be further formed. The dummy channel structure may be formed to limit and/or prevent leaning or bending of the first gate stack GS1 and obtain structural stability thereof in a fabricating process of the semiconductor device 100. Each of the plurality of dummy channel structures may have a similar structure and a similar shape to the plurality of channel structures 160.

In the connection region CON, a cell contact plug CNT, which penetrates the upper insulating layer 144 and the cover insulating layer 142, and is connected to the first gate electrode 130, may be arranged. The cell contact plug CNT may penetrate the upper insulating layer 144 and the cover insulating layer 142, and further penetrate the first insulating layer 140 covering the first gate electrode 130, to be connected to the first gate electrode 130.

A plurality of bit line contacts 170 may penetrate the upper insulating layer 144 to contact the conductive plugs 168 of the plurality of channel structures 160, and a plurality of bit lines 180 may be arranged on the plurality of bit line contacts 170. In example embodiments, sidewalls of the bit line 180 may be surrounded by the upper insulating layer 144, but unlike this case, the bit line 180 may be arranged on an upper surface of the upper insulating layer 144, and an additional insulating layer (not illustrated) surrounding the sidewalls of the bit line 180 may also be further arranged on the upper insulating layer 144.

The plurality of bit lines 180 may be apart from each other in the vertical direction (Z direction), and may be positioned at at least two different vertical levels and form at least two layers. In some embodiments, the plurality of bit lines 180 may include a plurality of lower bit lines 180L forming one layer at a relatively low vertical level from the upper surface of the substrate 110, and a plurality of upper bit lines 180H forming another layer at a relatively high vertical level. A lower surface of the upper bit line 180H may be at a higher vertical level than an upper surface of the lower bit line 180L.

The plurality of bit line contacts 170 may include a plurality of lower bit line contacts 170L connecting the conductive plugs 168 of the plurality of channel structures 160 to the plurality of lower bit lines 180L, and a plurality of upper bit line contacts 170H connecting the conductive plugs 168 of the plurality of channel structures 160 to the plurality of upper bit lines 180H. A height of the upper bit line contact 170H may be greater than a height of the lower bit line contact 170L in the vertical direction (Z direction). In some embodiments, a lower surface of the upper bit line contact 170H may be on the same vertical level as a lower surface of the lower bit line contact 170L, and an upper surface of the upper bit line contact 170H may be at a higher vertical level than an upper surface of the lower bit line contact 170L. For example, the upper bit line contact 170H may extend from an upper surface of the conductive plug 168 of the channel structure 160 to the lower surface of the upper bit line 180H, and the lower bit line contact 170L may extend from the upper surface of the conductive plug 168 of the channel structure 160 to the lower surface of the lower bit line 180L. In FIGS. 3 through 7B, each of the lower bit line contact 170L and the upper bit line contact 170H is illustrated as having a single contact plug shape, but this is only an example, and example embodiments are not limited thereto. For example, at least one bit line contact of the lower bit line contact 170L and the upper bit line contact 170H may have a stacked structure including at least one contact plug and at least one stud. In some embodiments, the upper bit line contact 170H may have a stacked structure including at least one more contact plug and/or at least one more stud than the lower bit line contact 170L.

The lower bit line 180L may be arranged on the lower bit line contact 170L, and the upper bit line 180H may be arranged on the upper bit line contact 170H. The plurality of lower bit lines 180L may extend on the channel structure 160 in a horizontal direction, and the plurality of upper bit lines 180H may extend on the plurality of lower bit lines 180L in a horizontal direction.

In some embodiments, each of the plurality of lower bit lines 180L may extend in the second horizontal direction (Y direction), be inclined at a certain inclination angle α with respect to the second horizontal direction (Y direction) and extend to a certain length, and then, extend in the second horizontal direction (Y direction) again. In some embodiments, each of the plurality of upper bit lines 180H may extend only in the second horizontal direction (Y direction). For example, the plurality of upper bit lines 180H may be apart from each other in the first horizontal direction (X direction), and extend in parallel with each other in the second horizontal direction (Y direction). In FIG. 5, the lower bit line 180L is illustrated as extending only in the second horizontal direction (Y direction), but this is to show that the lower bit line 180L is not cut off between a pair of the gate stack separation openings WLH but extends. However, example embodiments are not limited thereto, and a portion of the lower bit line 180L may extend at an inclination angle with respect to the second horizontal direction (Y direction) in a horizontal direction, that is different from the first horizontal direction (X direction) and the second horizontal direction (Y direction).

The plurality of upper bit lines 180H may include four upper bit lines adjacent to each other, that is, a first upper bit line 180aH, a second upper bit line 180bH, a third upper bit line 180cH, and a fourth upper bit line 180dH. Each of the first upper bit line 180aH, the second upper bit line 180bH, the third upper bit line 180cH, and the fourth upper bit line 180dH may be apart from each other in the first horizontal direction (X direction), and extend in the second horizontal direction (Y direction). For example, the first upper bit line 180aH may extend along a first extension line SL1, the second upper bit line 180bH may extend along a second extension line SL2, the third upper bit line 180cH may extend along a third extension line SL3, and the fourth upper bit line 180dH may extend along a fourth extension line SL4. The first extension line SL1, the second extension line SL2, the third extension line SL3, and the fourth extension line SL4 may be apart from each other in the first horizontal direction (X direction), and extend in the second horizontal direction (Y direction). The first extension line SL1, the second extension line SL2, the third extension line SL3, and the fourth extension line SL4 may be arranged at a distance of a first pitch P1 or a second pitch P2 in the first horizontal direction (X direction).

The first extension line SL1, the second extension line SL2, the third extension line SL3, and the fourth extension line SL4 may mean imaginary extension lines extending in the second horizontal direction (Y direction) on a two-dimensional plane extending in the first horizontal direction (X direction) and the second horizontal direction (Y direction), and that a certain component extends along the first extension line SL1, the second extension line SL2, the third extension line SL3, and the fourth extension line SL4 may mean that the certain component extends along the first extension line SL1, the second extension line SL2, the third extension line SL3, and the fourth extension line SL4, without considering a vertical level at which the certain component is positioned.

The plurality of lower bit lines 180L may include three lower bit lines adjacent to each other, that is, a first lower bit line 180aL, a second lower bit line 180bL, and a third lower bit line 180cL. The first lower bit line 180aL may extend along the first extension line SL1 in the second horizontal direction (Y direction), be inclined at a certain inclination angle α with respect to the second horizontal direction (Y direction) and extend to the second extension line SL2, and then, extend along the second extension line SL2 in the second horizontal direction (Y direction) again. The second lower bit line 180bL may extend along the second extension line SL2 in the second horizontal direction (Y direction), be inclined at the certain inclination angle α with respect to the second horizontal direction (Y direction) and extend to the third extension line SL3, and then, extend along the third extension line SL3 in the second horizontal direction (Y direction) again. The third lower bit line 180cL may extend along the third extension line SL3 in the second horizontal direction (Y direction), be inclined at the certain inclination angle α with respect to the second horizontal direction (Y direction) and extend to the fourth extension line SL4, and then, extend along the fourth extension line SL4 in the second horizontal direction (Y direction) again.

In some embodiments, both ends of the plurality of lower bit lines 180L between the gate stack separation opening WLH and the string selection line cut region SSLC may be on different extension lines that are adjacent to each other. For example, in the gate stack separation opening WLH, the first lower bit line 180aL may be on the first extension line SL1, the second lower bit line 180bL may be on the second extension line SL2, and the third lower bit line 180cL may be on the third extension line SL3, but in the string selection line cut region SSLC, the first lower bit line 180aL may be on the second extension line SL2, the second lower bit line 180bL may be on the third extension line SL3, and the third lower bit line 180cL may be on the fourth extension line SL4.

When the upper bit line 180H extending along the first extension line SL1, the second extension line SL2, the third extension line SL3, and the fourth extension line SL4 includes the first upper bit line 180aH, the second upper bit line 180bH, the third upper bit line 180cH, and the fourth upper bit line 180dH, that is, four bit lines, the lower bit line 180L extending along the first extension line SL1, the second extension line SL2, the third extension line SL3, and the fourth extension line SL4, may include the first lower bit line 180aL extending along the first extension line SL1 and the second extension line SL2 and extending from the first extension line SL1 to the second extension line SL2, the second lower bit line 180bL extending along the second extension line SL2 and the third extension line SL3 and extending from the second extension line SL2 to the third extension line SL3, and the third lower bit line 180cL extending along the third extension line SL3 and the fourth extension line SL4 and extending from the third extension line SL3 to the fourth extension line SL4, that is, three lower bit lines.

In other words, the number of lower bit lines 180L may be less than the number of upper bit lines 180H by at least one. In FIGS. 3 through 6B, it is illustrated that three lower bit lines 180L are arranged in a region, which is occupied by four upper bit lines 180H horizontally, that is, in a top view, and thus, four upper bit lines 180H and three lower bit lines 180L constitute one set and are repeated in the first horizontal direction (X direction), but example embodiments are not limited thereto. For example, it may also be possible that four or more upper bit lines 180H and lower bit lines 180L having the number thereof less than the number of upper bit lines 180H by one constitute one set, the number of upper bit lines 180H constituting the one set may be four to several hundreds, or several thousands, and the number of lower bit lines 180L corresponding thereto may be less than the number of upper bit lines 180H by one. The number of lower bit lines 180L may be less than the number of upper bit lines 180H by the number of sets constituted by the plurality of lower bit lines 180L and the plurality of upper bit lines 180H of the semiconductor device 100.

In example embodiments, as illustrated in FIG. 6A, the lower bit line 180L may include a first lower segment 180L-S1 extending in the second horizontal direction (Y direction), a second lower segment 180L-S2 apart from the first lower segment 180L-S1 in the first horizontal direction (X direction) and extending in the second horizontal direction (Y direction), and a first lower bending portion 180L-B1 connecting the first lower segment 180L-S1 to the second lower segment 180L-S2.

In a plan view, the first lower bending portion 180L-B1 may extend at an inclination angle with respect to the second horizontal direction (Y direction) in a horizontal direction different from each of the first horizontal direction (X direction) and the second horizontal direction (Y direction). The first lower bending portion 180L-B1 may be inclined at an inclination angle α of about 20 degrees to about 70 degrees with respect to the second horizontal direction (Y direction), and extend to a certain length. In some embodiments, the first lower bending portion 180L-B1 may be inclined at an inclination angle α of about 30 degrees to about 60 degrees with respect to the second horizontal direction (Y direction), but is not limited thereto. The inclination angle α of the first lower bending portion 180L-B1 with respect to the second horizontal direction (Y direction) may vary according to a size and an arrangement of the channel structure 160.

In example embodiments, as illustrated in FIG. 6A, respective locations in the second horizontal direction (Y direction) of the first lower bending portions 180L-B1 of the first lower bit line 180aL, the second lower bit line 180bL, and the third lower bit line 180cL may be different from each other, and a set of the first lower bit line 180aL, the second lower bit line 180bL, and the third lower bit line 180cL may be repeatedly arranged in the first horizontal direction (X direction).

In example embodiments, respective first lower segments 180L-S1 of the first lower bit line 180aL, the second lower bit line 180bL, and the third lower bit line 180cL may be substantially in parallel with each other, respective first lower bending portions 180L-B1 of the first lower bit line 180aL, the second lower bit line 180bL, and the third lower bit line 180cL may be substantially in parallel with each other, and respective second lower segments 180L-S2 of the first lower bit line 180aL, the second lower bit line 180bL, and the third lower bit line 180cL may be substantially in parallel with each other. In addition, the first lower segment 180L-S1 of the first lower bit line 180aL may be arranged on the first extension line SL1, the first lower segment 180L-S1 of the second lower bit line 180bL and the second lower segment 180L-S2 of the first lower bit line 180aL may be arranged on a straight line, that is, the second extension line SL2, the first lower segment 180L-S1 of the third lower bit line 180cL and the second lower segment 180L-S2 of the second lower bit line 180bL may be arranged on a straight line, that is, the third extension line SL3, and the second lower segment 180L-S2 of the third lower bit line 180cL may be arranged on the fourth extension line SL4.

The first lower segment 180L-S1 and the second lower segment 180L-S2 of each of the plurality of lower bit lines 180L may have a first width W in the first horizontal direction (X direction), and the first lower segment 180L-S1 and the second lower segment 180L-S2 of each of the plurality of lower bit lines 180L may have a first pitch P1 in the first horizontal direction (X direction). Each of the plurality of upper bit lines 180H may have a second width W2 in the first horizontal direction (X direction), and the plurality of upper bit lines 180H may be arranged at a second pitch P2 in the first horizontal direction (X direction). The first pitch P1 may be greater than the first width W, and the second pitch P2 may be greater than the second width W2. The second width W2 may be the same as, or greater than the first width W1. The first pitch P1 and the second pitch P2 may be substantially the same as each other. The first width W1 and the second width W2 may have values of several tens of nanometers.

A lower expansion space HS defined by the first lower bending portions 180L-B1 of two lower bit lines 180L may be positioned between two lower bit lines 180L adjacent to each other among the plurality of lower bit lines 180L. The upper bit line contact 170H may be arranged in the lower expansion space HS. In other words, the upper bit line contact 170H may connect the upper bit line 180H to the conductive plugs 168 of the plurality of channel structures 160 via the lower expansion space HS.

The lower expansion space HS may generally have a parallelogram shape formed by the first lower segment 180L-S1 and the first lower bending portion 180L-B1 of one lower bit line 180L of two lower bit lines 180L adjacent to each other, and the second lower segment 180L-S2 and the first lower bending portion 180L-B1 of the other lower bit line 180L. The lower expansion space HS may have an expansion width G1, which is greater than a width between the first lower segments 180L-S1 and a width between the second lower segments 180L-S2 of two respective lower bit lines 180L adjacent to each other in the first horizontal direction (X direction). For example, the expansion width G1 may be greater than the first pitch P1. In some embodiments, the expansion width G1 may be greater than the first pitch P1, and less than two times the first pitch P1. For example, the expansion width G1 may be equal to a sum of the first pitch P1 and the first width W1. The first pitch P1 may be substantially the same as the second pitch P2, and the expansion width G1 may be greater than the second pitch P2 and less than two times the second pitch P2. For example, the expansion width G1 may be equal to a sum of the second pitch P2 and the first width W1.

Because the upper bit line contact 170H is arranged in the lower expansion space HS, a horizontal width of each of the plurality of upper bit line contacts 170H may be less than the expansion width G1.

A width between the first lower segments 180L-S1 and a width between the second lower segments 180L-S2 of each of two lower bit lines 180L adjacent to each other may be equal to a difference between the first pitch P1 and the first width W1.

A bending region between the first lower segment 180L-S1 and the first lower bending portion 180L-B1 of one lower bit line 180L of two lower bit lines 180L adjacent to each other may be apart from a bending region between the first lower segment 180L-S1 and the first lower bending portion 180L-B1 of the other lower bit line 180L by a first distance D1 in the second horizontal direction (Y direction). The first distance D1 may be greater than the expansion width G1. The bending region between the first lower segment 180L-S1 and the first lower bending portion 180L-B1 of one lower bit line 180L may be apart from a bending region between the second lower segment 180L-S2 and the first lower bending portion 180L-B1 by a second distance D2 in the second horizontal direction (Y direction). A bending region between the second lower segment 180L-S2 and the first lower bending portion 180L-B1 of one lower bit line 180L of two lower bit lines 180L adjacent to each other may be apart from a bending region between the first lower segment 180L-S1 and the first lower bending portion 180L-B1 of the other lower bit line 180L by a third distance D3 in the second horizontal direction (Y direction). In some embodiment, the second distance D2 may be less than the third distance D3. A sum of the second distance D2 and the third distance D3 may be equal to the first distance D1.

In the semiconductor device 100 according to inventive concepts, because the plurality of bit lines 180 constituting at least two layers, that is, the plurality of lower bit lines 180L and the plurality of upper bit lines 180H are included, and the upper bit line contact 170H connected to the upper bit line 180H are arranged in an expansion space GS defined by two lower bit lines 180L adjacent to each other, horizontal widths of the bit line 180 and the bit line contact 170 may be formed relatively large. Accordingly, the bit line contact 170 and the bit line 180 connected to the plurality of channel structures 160 arranged with the same degree of integration may be formed relatively large. For example, when an extreme ultraviolet (EUV) exposure process or quadruple patterning technology (QPT) is used to connect a plurality of channel structures to each other by using only a plurality of bit lines constituting one layer and a plurality of bit line contacts connected thereto, the bit line contact 170 and the bit line 180 included in the semiconductor device 100 according to inventive concepts may also be formed by using a deep ultraviolet (DUV) exposure process or double patterning technology (DPT). Thus, process cost or process difficulty of forming the bit line contact 170 and the bit line 180 included in the semiconductor device 100 may be reduced, and the channel holes, in which the plurality of channel structures 160 are arranged, may be arranged at a narrow pitch.

In addition, because a width of the bit line 180 of the semiconductor device 100 according to inventive concepts may be formed relatively large, and thus, the number of the channel structures 160 arranged between a pair of the gate stack separation openings WLH may be increased, the number of gate stack separation openings WLH included in the semiconductor device 100 may be reduced, and a size of the semiconductor device 100 may be reduced.

Figure 8A:
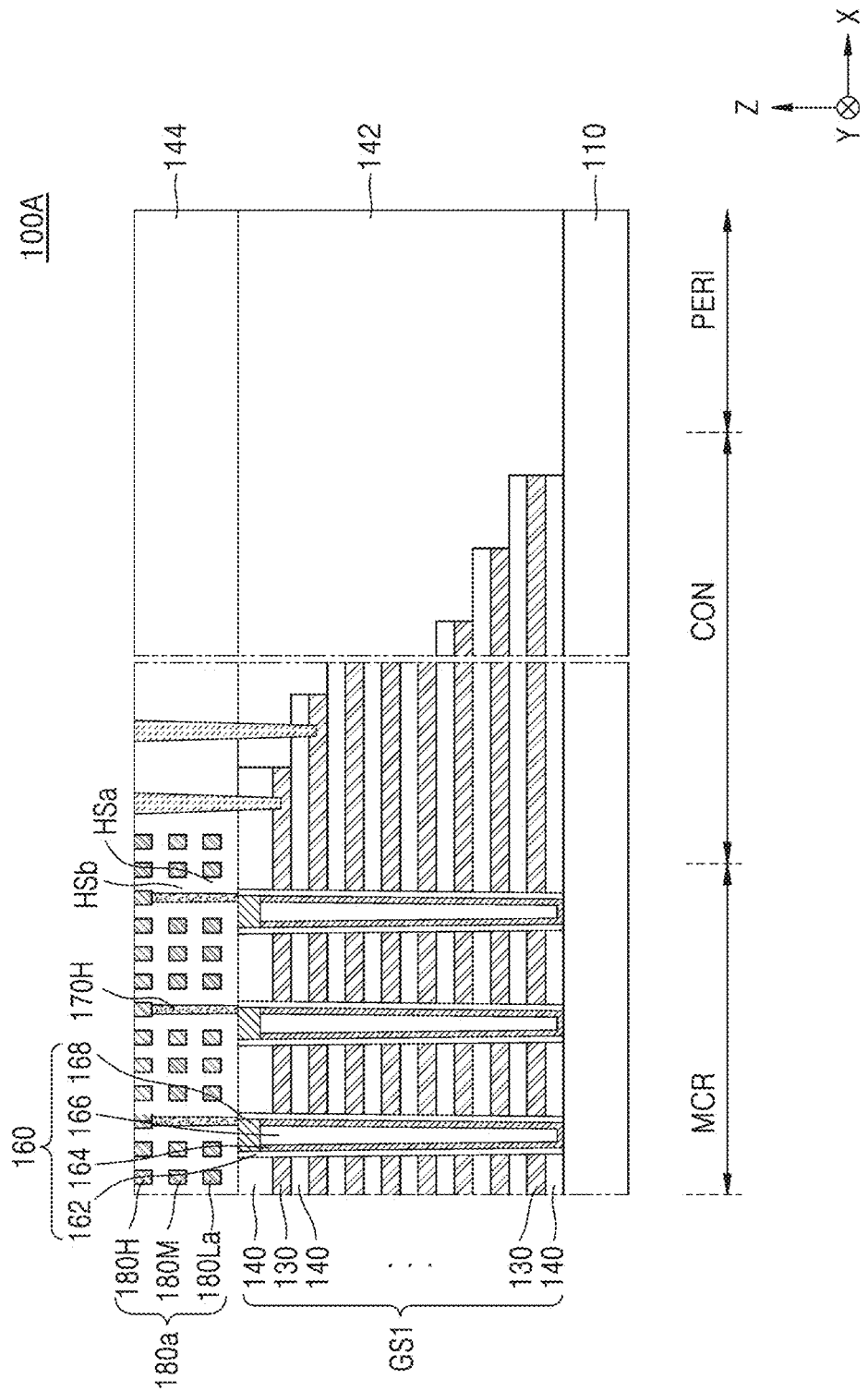
FIGS. 8A through 8C are cross-sectional views of a semiconductor device according to example embodiments.
Figure 8B:
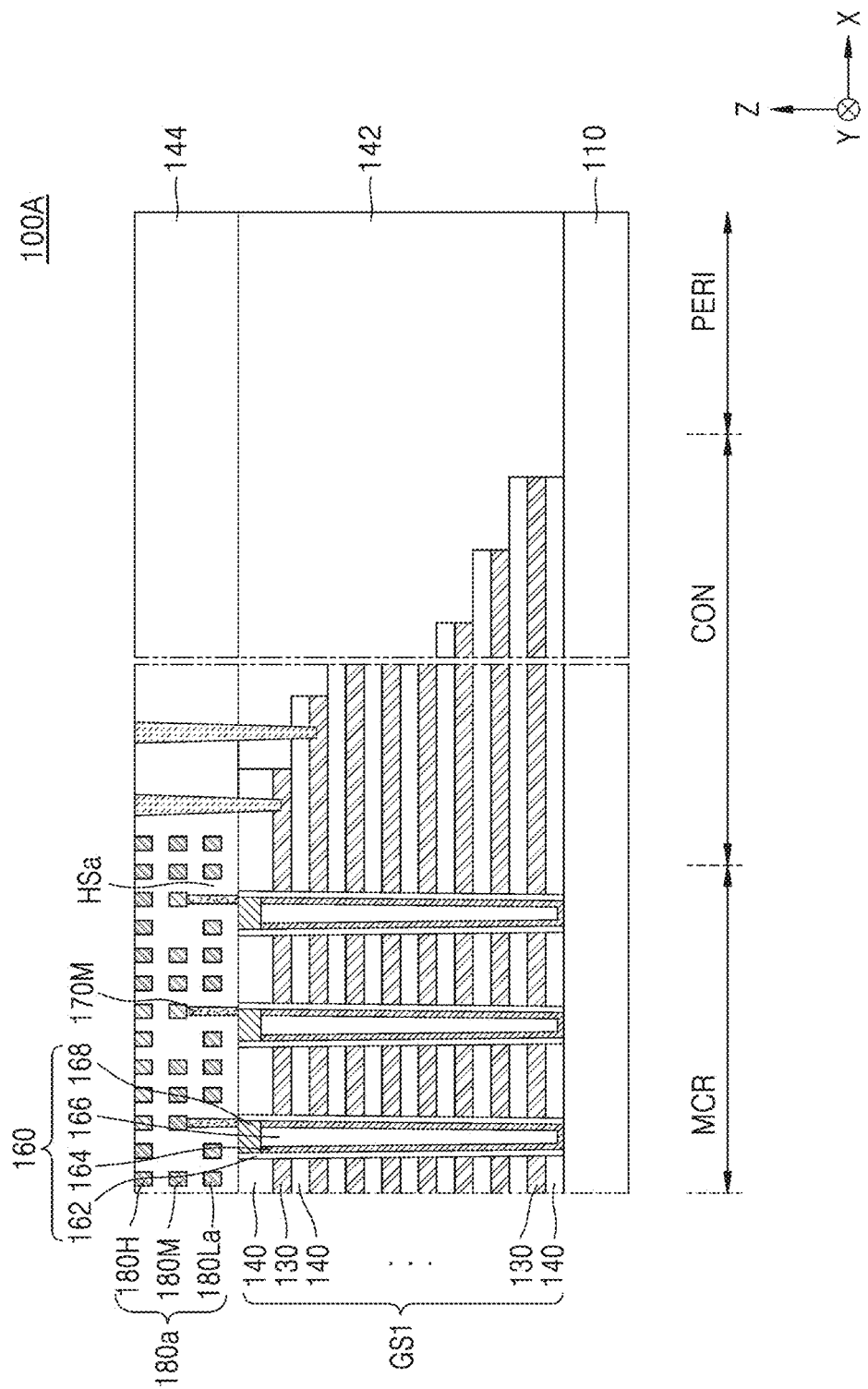
Figure 8C:
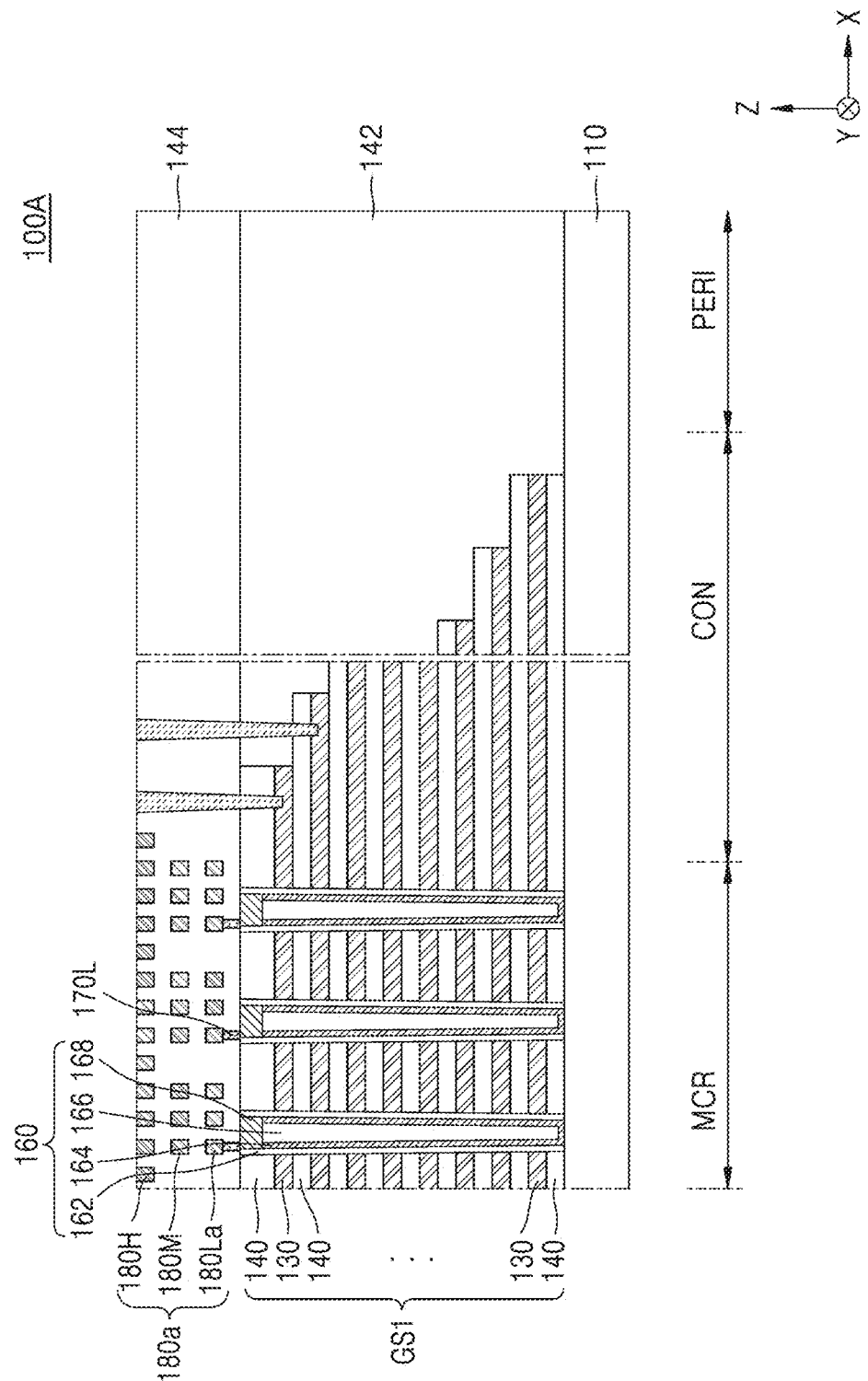
Figure 9:
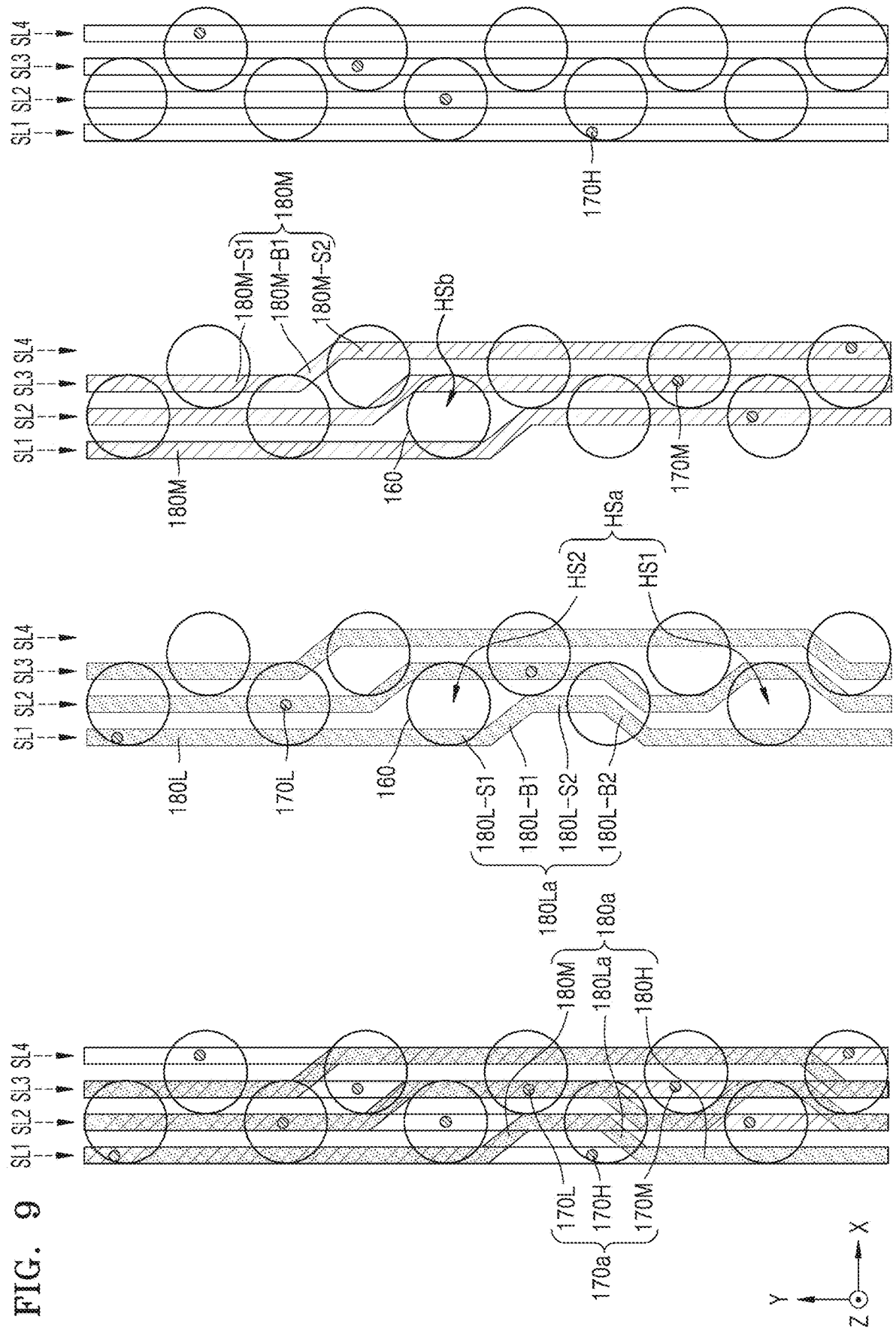
FIG. 9 illustrates enlarged plan views of portions of the semiconductor device of FIGS. 8A through 8C.

FIGS. 8A through 8C are cross-sectional views of a semiconductor device 100A according to example embodiments, and FIG. 9 illustrates enlarged plan views of portions of the semiconductor device of FIGS. 8A through 8C. In FIGS. 8A and 9, identical reference numerals in FIGS. 1 through 7B may be referred to as identical components, and thus, duplicate descriptions thereof given with reference to FIGS. 1 through 7B may be omitted.

Referring to FIGS. 8A through 9 together, the semiconductor device 100A may include a plurality of bit line contacts 170a penetrating the upper insulating layer 144 and contacting the conductive plugs 168 of the plurality of channel structures 160, and a plurality of bit lines 180a arranged on the plurality of bit line contacts 170a.

The plurality of bit lines 180a may be apart from each other in the vertical direction (Z direction), and may be positioned at at least three different vertical levels and form at least three layers. In some embodiments, the plurality of bit lines 180a may include the plurality of lower bit lines 180La forming one layer at a relatively low vertical level from the upper surface of the substrate 110, a plurality of upper bit lines 180H forming another layer at a relatively high vertical level, and a plurality of intermediate bit lines 180M forming another layer at a vertical level between the plurality of lower bit lines 180La and the plurality of upper bit lines 180H. The lower surface of the upper bit line 180H may be at a higher vertical level than an upper surface of the intermediate bit line 180M, and a lower surface of the intermediate bit line 180M may be at a higher vertical level than an upper surface of the lower bit line 180La.

The plurality of bit line contacts 170a may include a plurality of lower bit line contacts 170L connecting the conductive plugs 168 of the plurality of channel structures 160 to the plurality of lower bit lines 180La, a plurality of intermediate bit line contacts 170M connecting the conductive plugs 168 of the plurality of channel structures 160 to the plurality of intermediate bit lines 180M, and the plurality of upper bit line contacts 170H connecting the conductive plugs 168 of the plurality of channel structures 160 to the plurality of upper bit lines 180H. In the vertical direction (Z direction), the height of the upper bit line contact 170H may be greater than a height of the intermediate bit line contacts 170M, and the height of the intermediate bit line contacts 170M may be greater than the height of the lower bit line contact 170L. In some embodiments, the lower surface of the upper bit line contact 170H, a lower surface of the intermediate bit line contact 170M, and the upper surface of the lower bit line contact 170L may be at the same vertical level, the upper surface of the upper bit line contact 170H may be at a higher vertical level than an upper surface of the intermediate bit line contact 170M, and the upper surface of the intermediate bit line contact 170M may be at a higher vertical level than the upper surface of the lower bit line contact 170L. For example, the upper bit line contact 170H may extend from the upper surface of the conductive plug 168 of the channel structure 160 to the lower surface of the upper bit line 180H, the intermediate bit line contact 170M may extend from the upper surface of the conductive plug 168 of the channel structure 160 to the lower surface of the intermediate bit line 180M, and the lower bit line contact 170L may extend from the upper surface of the conductive plug 168 of the channel structure 160 to the lower surface of the lower bit line 180La.

The lower bit line 180La may be arranged on the lower bit line contact 170L, and the intermediate bit line 180M may be arranged on the intermediate upper bit line contact 170M, and the upper bit line 180H may be arranged on the upper bit line contact 170H. The plurality of lower bit lines 180La may extend on the channel structure 160 in a horizontal direction, the plurality of intermediate bit lines 180M may extend on the plurality of lower bit lines 180La in a horizontal direction, and the plurality of upper bit lines 180H may extend on the plurality of intermediate bit lines 180M in a horizontal direction.

The number of lower bit lines 180La and the number of intermediate bit lines 180M may be less than the number of upper bit lines 180H by at least one. The number of lower bit lines 180La may be the same as the number of intermediate bit lines 180M. In FIGS. 8A through 9, it is illustrated that three intermediate bit lines 180M and three lower bit lines 180La are arranged in a region, which is occupied by four upper bit lines 180H horizontally, that is, in a top view, and thus, four upper bit lines 180H, three intermediate bit lines 180M, and three lower bit lines 180La constitute one set and are repeated in the first horizontal direction (X direction), but example embodiments are not limited thereto. For example, it may also be possible that four or more upper bit lines 180H, and the intermediate bit lines 180M and the lower bit lines 180La, which have the numbers thereof less than the number of upper bit lines 180H by one, constitute one set, the number of upper bit lines 180H constituting the one set is four to several hundreds, or several thousands, and the numbers of intermediate bit lines 180M and lower bit lines 180La corresponding thereto may be less than the number of upper bit lines 180H by one. The numbers of lower bit lines 180La and intermediate bit lines 180M may be less than the number of upper bit lines 180H by the number of sets constituted by the plurality of lower bit lines 180L and the plurality of upper bit lines 180H included in the semiconductor device 100A.

In example embodiments, as illustrated in FIG. 9, the lower bit line 180La may include a plurality of first lower segments 180L-S1 extending in the second horizontal direction (Y direction), the second lower segment 180L-S2 apart from the plurality of first lower segments 180L-S1 in the first horizontal direction (X direction) and extending in the second horizontal direction (Y direction), the first lower bending portion 180L-B1 connecting one first lower segment 180L-S1 of the plurality of first lower segments 180L-S1 to the second lower segment 180L-S2, and a second lower bending portion 180-B2 connecting the other one first lower segment 180L-S1 of the plurality of first lower segments 180L-S1 to the second lower segment 180L-S2. The intermediate bit line 180M may include a first intermediate segment 180M-S1 extending in the second horizontal direction (Y direction), a second intermediate segment 180M-S2 apart from the first intermediate segment 180M-S1 in the first horizontal direction (X direction) and extending in the second horizontal direction (Y direction), and a first intermediate bending portion 180M-B1 connecting the first intermediate segment 180M-S1 to the second intermediate segment 180M-S2.

A planar shape of the intermediate bit line 180M including the first intermediate segment 180M-S1, the second intermediate segment 180M-S2, and the first intermediate bending portion 180M-B1 may be generally similar to a planar shape of the lower bit line 180L including the first lower segment 180L-S1, the second lower segment 180L-S2, and the first lower bending portion 180M-B1, and thus, detailed descriptions thereof are omitted.

A planar shape of each of a portion including the first lower segment 180L-S1, the second lower segment 180L-S2, and the first lower bending portion 180L-B1 connecting the first lower segment 180L-S1 to the second lower segment 180L-S2, and a portion including the second lower segment 180L-S2, the first lower segment 180L-S1, and the second lower bending portion 180-B2 connecting the second lower segment 180L-S2 to the first lower segment 180L-S1, among the lower bit line 180La including the first lower segment 180L-S1, the second lower segment 180L-S2, the first lower bending portion 180L-B1, and the second lower bending portion 180L, may be generally similar to a planar shape of the lower bit line 180L including the first lower segment 180L-S1, the second lower segment 180L-S2, and the first lower bending portion 180L-B1 described with reference to FIGS. 3 through 7B, and thus, detailed descriptions thereof are omitted.

In other words, the lower bit line 180La described with reference to FIGS. 3 through 7B may include one bending portion, that is, the first lower bending portion 180L-B1, but the lower bit line 180La may include two bending portions, that is, the first lower bending portion 180L-B1 and the second lower bending portion 180L-B2.

Referring to FIGS. 3 and 9 together, FIG. 9 is an enlarged diagram of a portion corresponding to region C1X in FIG. 3, and illustrates a portion between the gate stack separation opening WLH and the string selection line cut region SSLC shown in FIG. 3. In some embodiments, both ends of the plurality of intermediate bit lines 180M between the gate stack separation opening WLH and the string selection line cut region SSLC may be on different extension lines adjacent to each other. In some embodiments, both ends of the plurality of intermediate bit lines 180M between the gate stack separation opening WLH and the string selection line cut region SSLC may be on identical extension lines.

A lower expansion space HSa, which is defined between the first lower bending portion 180L-B1 and the second lower bending portion 180L-B2 of one lower bit line 180La of two lower bit lines 180La and between respective first lower bending portions 180L-B1 of two lower bit lines 180La, may be between the two lower bit lines 180La adjacent to each other among the plurality of lower bit lines 180La. A portion, which generally is defined between the first lower bending portion 180L-B1 and the second lower bending portion 180-B2 of one lower bit line 180La of two lower bit lines 180La and generally has a trapezoidal shape, between two lower bit lines 180La adjacent to each other, may be referred to as a first lower expansion space HS1, and a portion, which is defined between the first lower bending portions 180L-B1 of each of two lower bit lines 180La and generally has a parallelogram shape, may be referred to as a second lower expansion space HS2.

An intermediate expansion space HSb, which is defined between respective first intermediate bending portions 180M-B1 of two intermediate bit lines 180M and generally has a trapezoidal shape, may be between two intermediate bit lines 180M adjacent to each other among the plurality of intermediate bit lines 180M.

The upper bit line contact 170H may connect the upper bit line 180H to the conductive plugs 168 of the plurality of channel structures 160 via the intermediate expansion space HSb and the lower expansion space HSa. The intermediate bit line contact 170M may connect the intermediate bit line 180M to the conductive plugs 168 of the plurality of channel structures 160 via the lower expansion space HSa.

The plurality of upper bit line contacts 170H may be arranged in some of the plurality of lower expansion spaces HSa, the plurality of intermediate bit line contacts 170M may be arranged in the other of the plurality of lower expansion spaces HSa, and the plurality of upper bit line contacts 170H may be arranged in the plurality of intermediate expansion spaces HSb. Accordingly, the number of the lower expansion spaces HSa arranged between two lower bit lines 180La adjacent to each other may be greater than the number of the intermediate expansion spaces HSb arranged between the intermediate bit lines 180M adjacent to each other. In FIG. 9, it is illustrated that the number of the lower expansion spaces HSa arranged between two lower bit lines 180La adjacent to each other is two times the number of the intermediate expansion spaces HSb arranged between two intermediate bit lines 180M adjacent to each other, but example embodiments are not limited thereto, and the number of the lower expansion spaces HSa may vary according to respective numbers of the plurality of upper bit line contacts 170H and the plurality of intermediate bit line contacts 170M.

In FIGS. 3 through 7B, it is illustrated that the plurality of bit lines 180 including the plurality of lower bit lines 180L and the plurality of upper bit lines 180H constitute two layers, and in FIGS. 8A through 9, it is illustrated that the plurality of bit lines 180*a* including the plurality of lower bit lines 180La, the plurality of intermediate bit lines 180M, and the plurality of upper bit lines 180H constitute three layers, but example embodiments are not limited thereto, and a plurality of bit lines may also constitute three or more layers.

In FIGS. 3 through 7B, it is illustrated that the semiconductor device 100 includes the plurality of lower bit lines 180L including the first lower bending portion 180L-B1, but it may also be possible that the semiconductor device 100 includes the plurality of lower bit lines 180La including the first lower bending portion 180L-B1 and the second lower bending portion 180-B2 together, and the number of lower bending portions included in a lower bit line and the number of intermediate bending portions included in an intermediate bit line may be variously changed.

In addition, in FIGS. 8A through 9, it is illustrated that the lower bit line 180La includes two lower bending portions (that is, the first lower bending portion 180L-B1 and the second lower bending portion 180-B2), and the intermediate bit line 180M includes one intermediate bending portion (that is, the first lower bending portion 180M-B1), but it may also be possible to modify so that the number of intermediate bending portions included in the intermediate bit line 180M is greater than the number of the lower bending portions included in the lower bit line 180La, for example, the lower bit line 180La includes one lower bending portion and the intermediate bit line 180M includes two intermediate bending portions.

Figure 10:
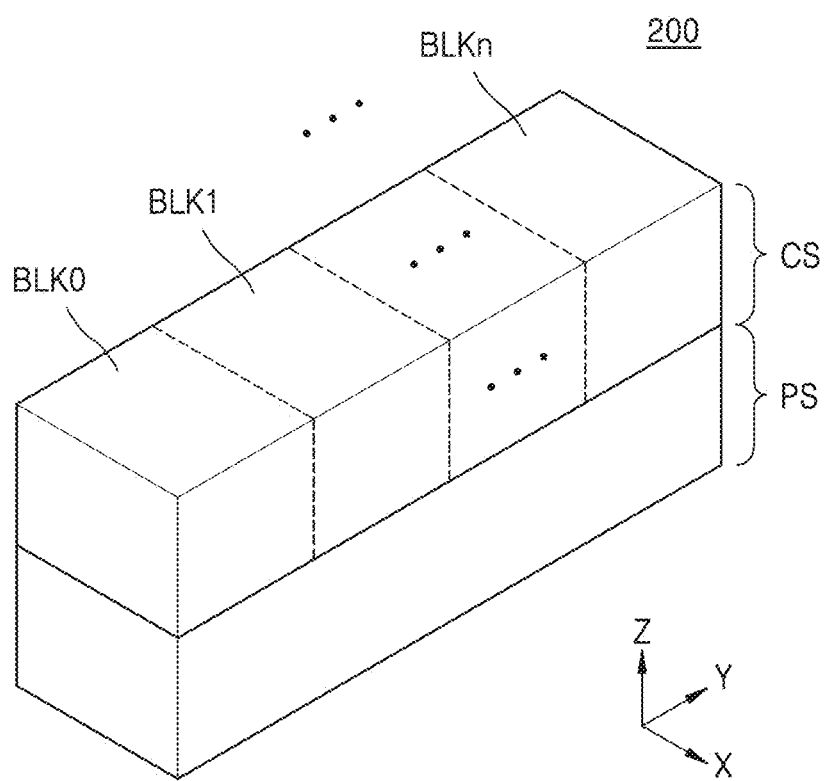
FIG. 10 is a perspective view of a semiconductor device according to an example embodiment.
Figure 11:
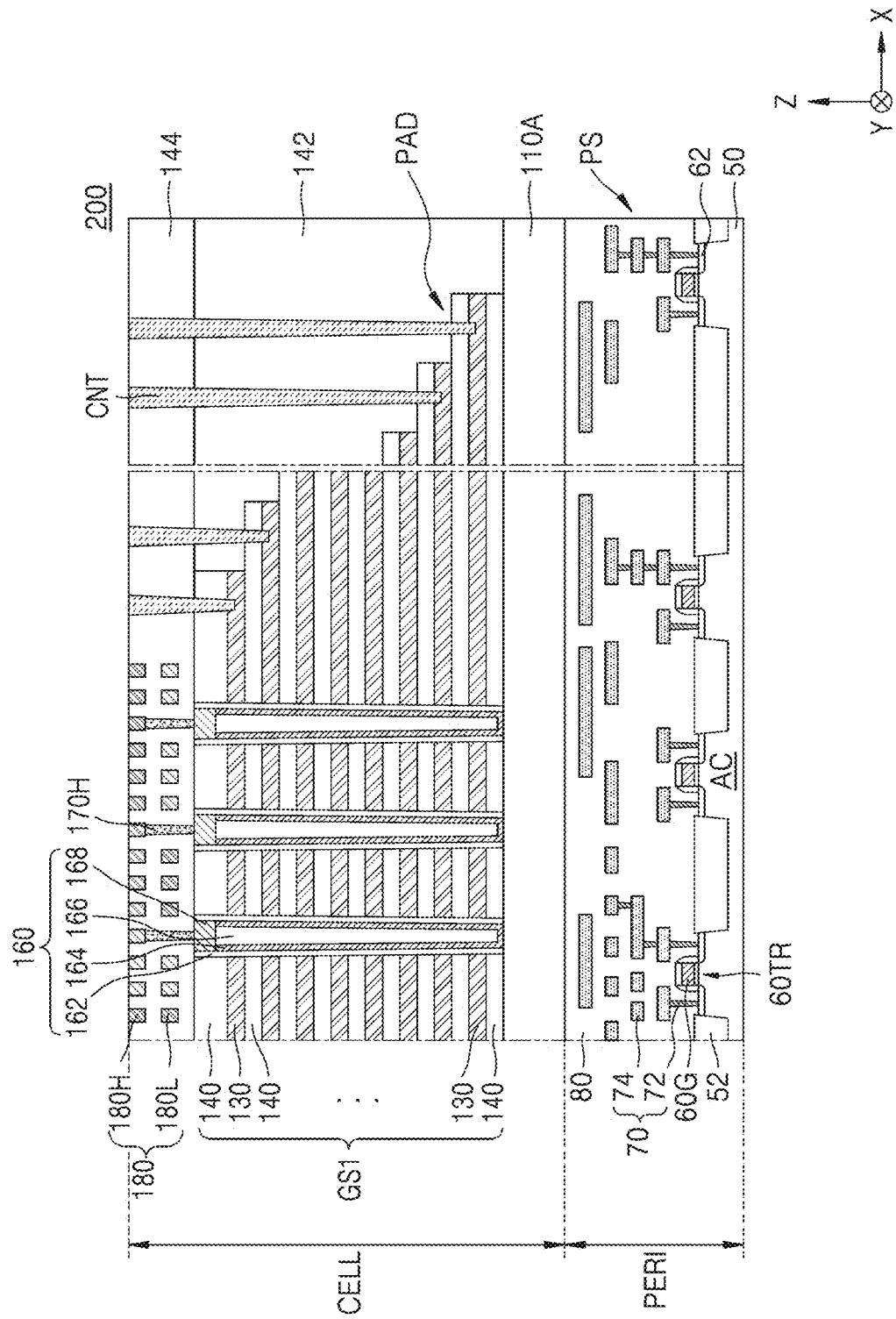
FIG. 11 is a cross-sectional view of the semiconductor device of FIG. 10.

FIG. 10 is a perspective view of a semiconductor device 200 according to an example embodiment, FIG. 11 is a cross-sectional view of the semiconductor device 200 of FIG. 10. In FIGS. 10 and 11, the same reference numerals as those in FIGS. 1 through 9 may denote the same components.

Referring to FIGS. 10 and 11 together, the semiconductor device 200 may include a cell array structure CS and a periphery circuit structure PS, which overlap each other in the vertical direction (Z direction). The cell array structure CS may include the memory cell array 20 described with reference to FIG. 1, and the periphery circuit structure PS may include the periphery circuit 30 described with reference to FIG. 1.

The cell array structure CS may include the plurality of memory cell blocks (BLK1, BLK2, . . . , BLKn). Each of the plurality of memory cell blocks (BLK1, BLK2, . . . , BLKn) may include memory cells, which are three-dimensionally arranged. The cell array structure CS may include a cell region CELL, and the cell region CELL may include the memory cell region MCR and the connection region CON described with reference to FIGS. 3 through 9. The periphery circuit structure PS may include the periphery circuit region PERI. Although not illustrated, the cell region CELL may also further include a through electrode region, where a plurality of through electrodes (not illustrated) for electrical connection between the memory cell region MCR and the periphery circuit region PERI arranged at a lower vertical level than the memory cell region MCR are arranged. The through electrode region may be formed on a boundary portion between the memory cell region MCR and the connection region CON, or inside the connection region CON.

The periphery circuit structure PS may include a periphery circuit transistor 60TR and a periphery circuit distribution structure 70. On a substrate 50, the active region AC may be defined by an element separation layer 52, and a plurality of periphery circuit transistors 60TR may be formed in the active region AC. The plurality of periphery circuit transistors 60TR may include periphery circuit gates 60G, and source/drain regions 62 arranged on both sides of the periphery circuit gates 60G in portions of the substrate 50.

The substrate 50 may include a semiconductor material such as a Group IV semiconductor material, a Group III-V semiconductor material, and a Group II-VI semiconductor material. The Group IV semiconductor material may include, for example, silicon (Si), germanium (Ge), or Si—Ge. The Group III-V semiconductor material may include, for example, gallium arsenide (GaAs), indium phosphor (InP), GaP, InAs, indium antimony InSb, or InGaAs. The Group II-VI semiconductor material may include, for example, zinc telluride (ZnTe), or cadmium sulfide (CdS). The substrate 50 may include a bulk wafer or an epitaxial layer. In other embodiments, the substrate 50 may include a silicon-on-insulator (SOI) substrate or a germanium-on-insulator (GeOI) substrate.

The periphery circuit distribution structure 70 may include a plurality of periphery circuit contacts 72 and a plurality of periphery circuit distribution layers 74. On the substrate 50, an interlayer insulating layer 80 covering the plurality of periphery circuit transistors 60TR and the periphery circuit distribution structure 70 may be arranged. The plurality of periphery circuit distribution layers 74 may have a multilayer structure including a plurality of metal layers arranged at different vertical levels from each other. In FIG. 11, as an example, it is illustrated that all of the plurality of periphery circuit distribution layers 74 are formed at the same height, but, unlike this case, the periphery circuit distribution layer 74 arranged at a certain level (for example, at the uppermost level) may also be formed higher than the periphery circuit distribution layer 74 at another level.

A base structure 110A may be arranged on the interlayer insulating layer 80. In example embodiments, the base structure 110A may function as a source region providing current to vertical-type memory cells formed in the cell array structure CS. In some embodiments, the base structure 110A may include some regions performing a function of the common source line CSL described with reference to FIG. 2.

In example embodiments, the base structure 110A may include a semiconductor material such as Si, Ge, and Si—Ge. On the base structure 110A, the first gate stack GS1 may extend in the first horizontal direction (X direction) and the second horizontal direction (Y direction), which are in parallel with an upper surface of the base structure 110A.

Figure 12:
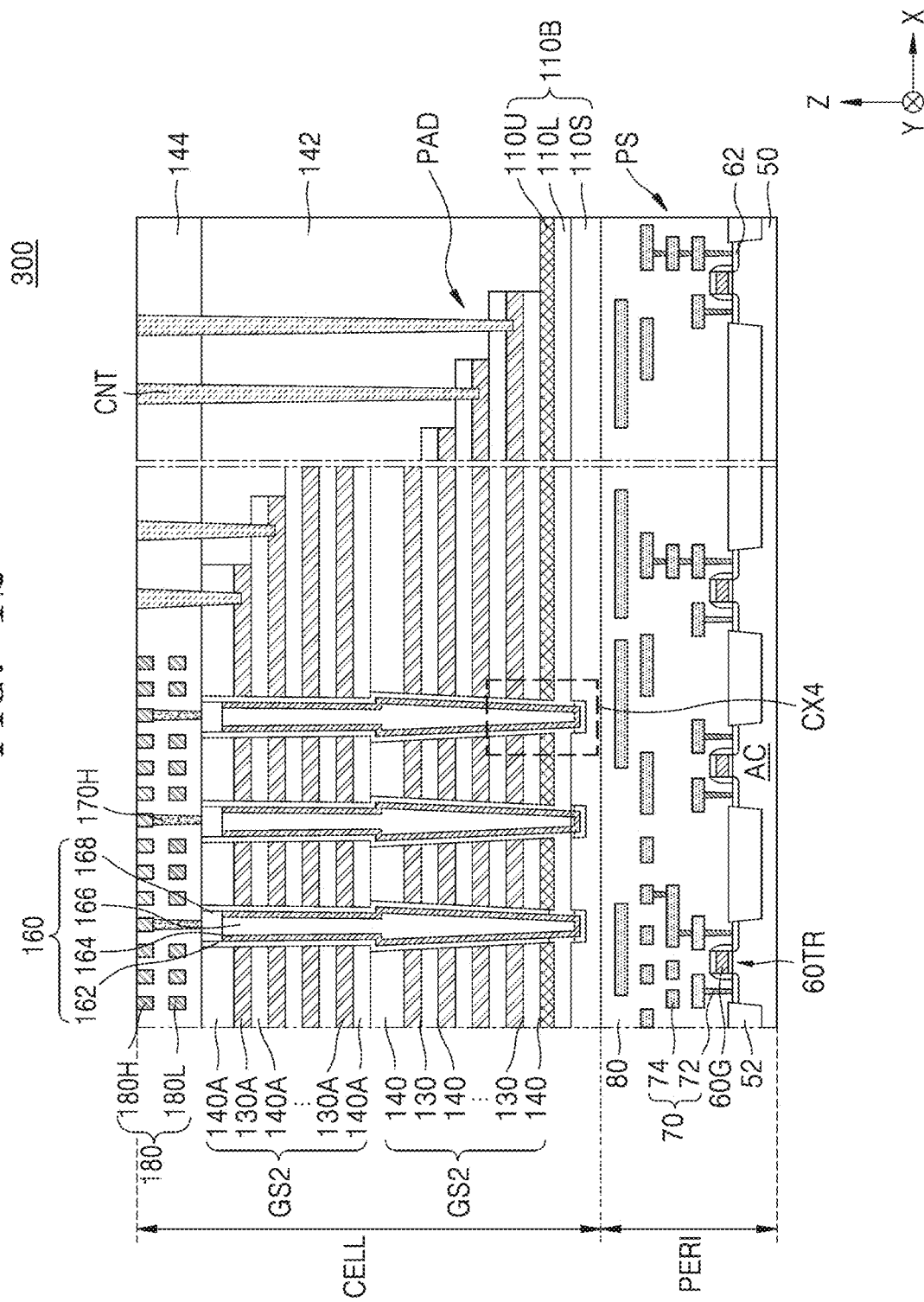
FIGS. 12 and 13 are drawings of a semiconductor device according to example embodiments.
Figure 13:
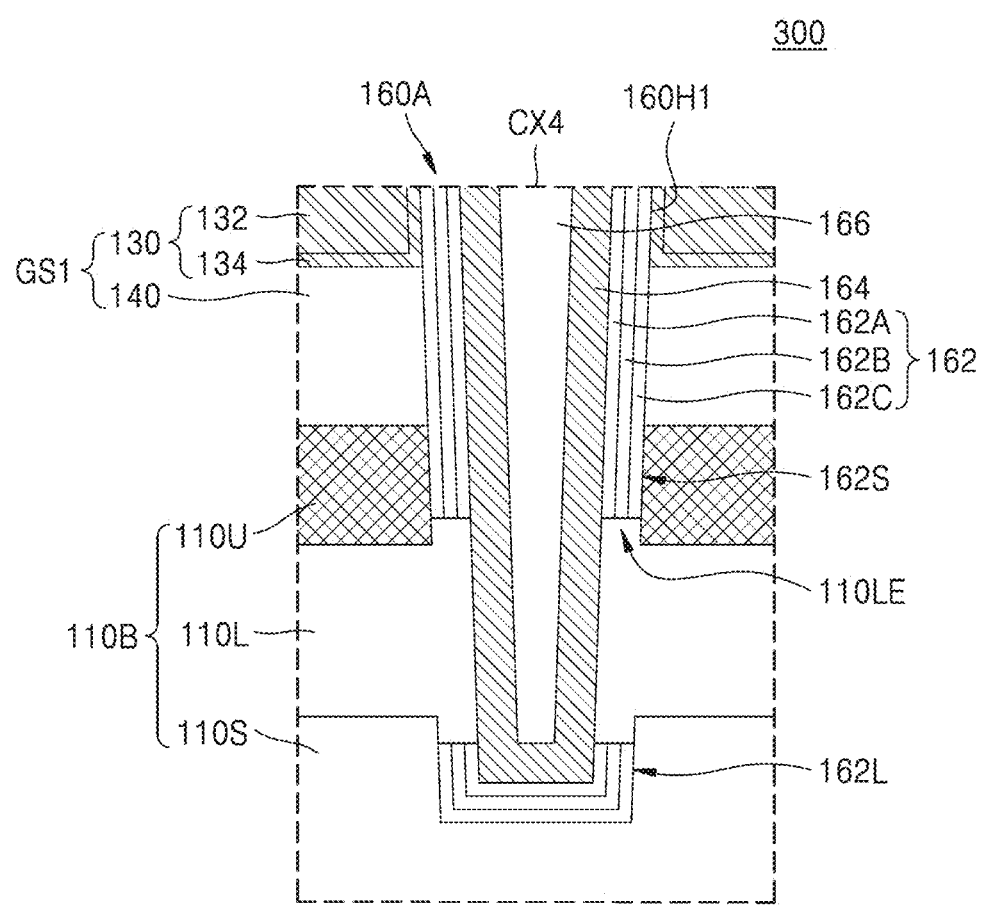

FIGS. 12 and 13 are drawings of a semiconductor device 300, according to example embodiments. FIG. 12 is a cross-sectional view of the semiconductor device 300 according to an example embodiment, and FIG. 13 is an enlarged cross-sectional view of region CX4 in FIG. 12.

Referring to FIGS. 12 and 13 together, a base substrate 110B may be arranged on the periphery circuit structure PS, and the base substrate 110B may include a base substrate 110S, a lower base layer 110L, an upper base layer 110U, which are sequentially arranged on the interlayer insulating layer 80.

The base substrate 110S may include a semiconductor material such as silicon. The lower base layer 110L may include polysilicon with impurities doped thereon or polysilicon with no impurities doped thereon, and the upper base layer 110U may include polysilicon with impurities doped thereon or polysilicon with no impurities doped thereon. The lower base layer 110L may correspond to the common source line CSL described with reference to FIG. 2. The upper base layer 110U may function as a support layer to limit and/or prevent a mold stack from collapsing or falling in a process of removing a sacrificial layer (not illustrated) for forming the lower base layer 110L.

The first gate stack GS1 may be arranged on the base substrate 110B, and a second gate stack GS2 may be arranged on the first gate stack GS1. The first gate stack GS1 may include the plurality of first gate electrodes 130 and the plurality of first insulating layers 140, which are alternately arranged, and the second gate stack GS2 may include a plurality of second gate electrodes 130A and a plurality of second insulating layers 140A, which are alternately arranged.

A plurality of channel structures 160A may be formed inside a first channel hole 160H1 penetrating the first gate stack GS1 and inside a second channel hole 160H2 penetrating the second gate stack GS2. The plurality of channel structures 160A may have a shape in which the plurality of channel structures 160A protrude outwardly from a boundary between the first channel hole 160H1 and the second channel hole 160H2 toward the outside.

Figure 16:
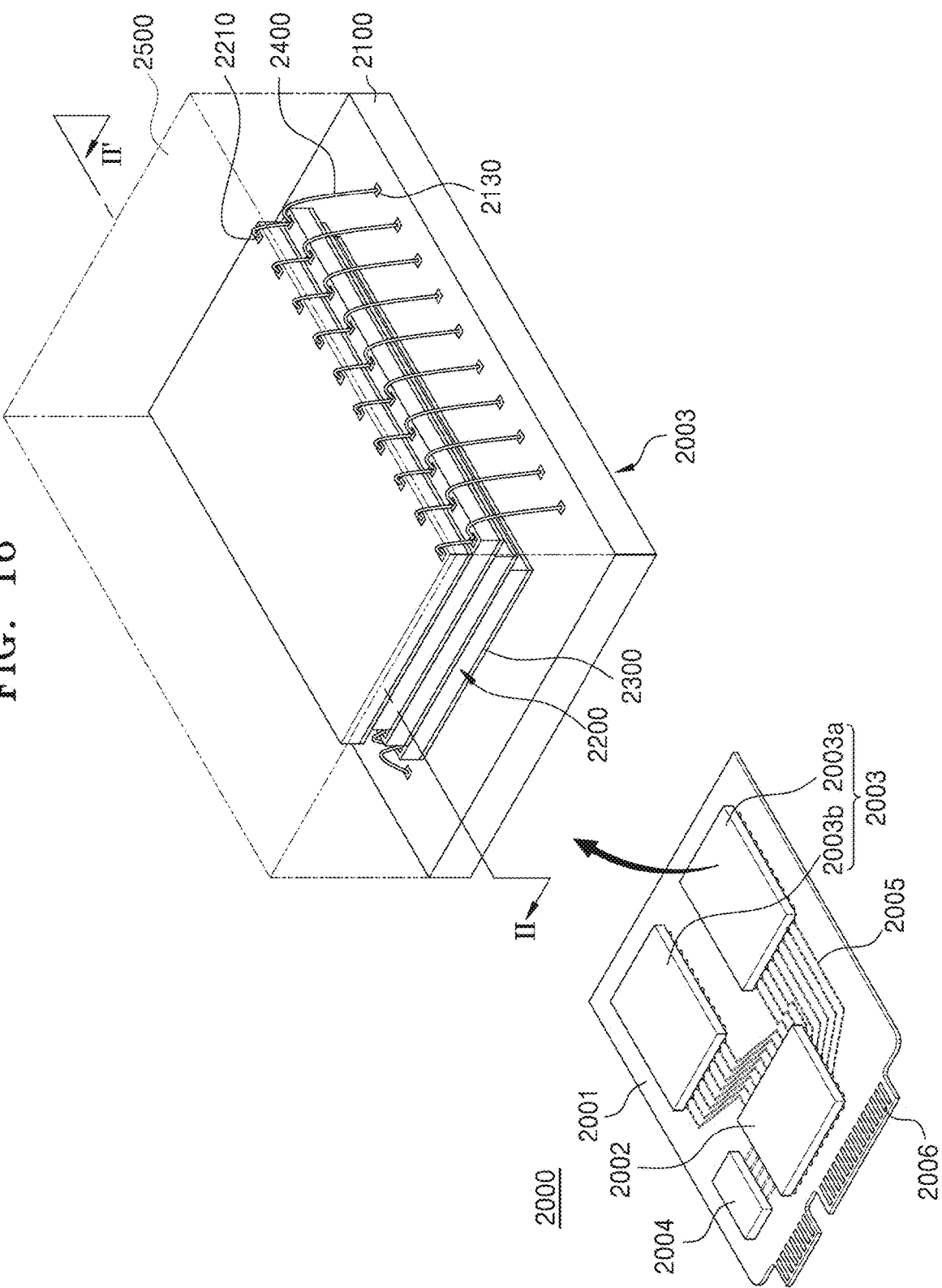
FIG. 16 is a schematic perspective view of an electronic system including a semiconductor device, according to an example embodiment.

The plurality of channel structures 160A may penetrate the upper base layer 110U and the lower base layer 110L, and contact the base substrate 110S. As illustrated in FIG. 16, the gate insulating layer 162 may be removed at the same level as the lower base layer 110L, and the channel layer 164 may contact an extension portion 110LE of the lower base layer 110L. A sidewall portion 162S and a bottom portion 162L of the gate insulating layer 162 may be arranged apart from each other with the extension portion 110LE of the lower base layer 110L therebetween, and because the bottom portion 162L of the gate insulating layer 162 surrounds a bottom surface of the channel layer 164, the channel layer 164 may be electrically connected to the lower base layer 110L instead of directly contacting the base substrate 110S.

Figure 14:
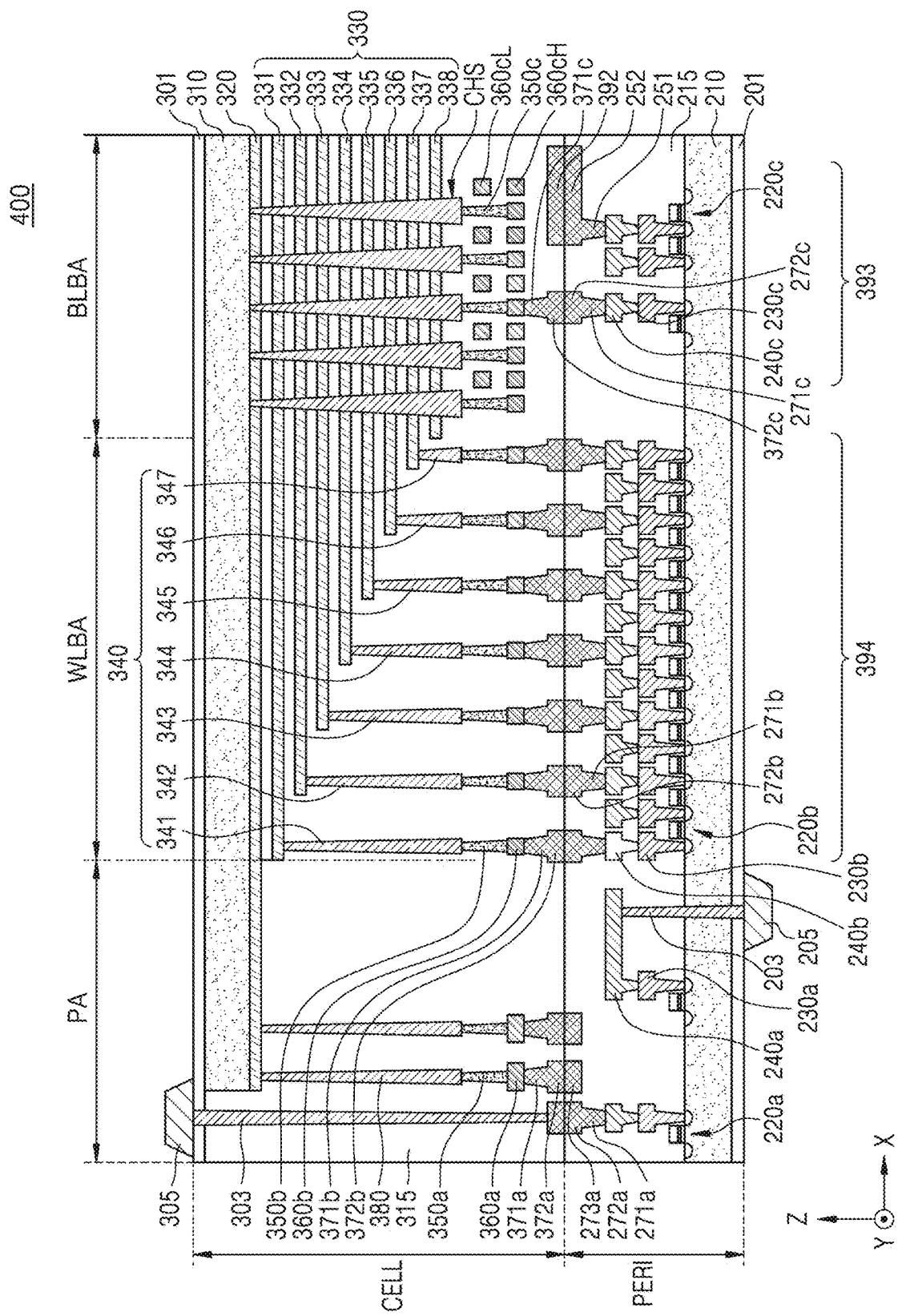
FIG. 14 is a cross-sectional view of a semiconductor device according to an example embodiment.

FIG. 14 is a cross-sectional view of a semiconductor device 400 according to an example embodiment.

Referring to FIG. 14, the semiconductor device 400 may have a chip to chip (C2C) structure. The C2C structure may mean a structure in which, after an upper chip including the cell region CELL is fabricated on a first wafer, and a lower chip including the periphery circuit region PERI is fabricated on a second wafer different from the first wafer, the upper chip and the lower chip are connected to each other by using a bonding method. For example, the bonding method may mean a method of electrically connecting a bonding metal formed on an uppermost metal layer of the upper chip to a bonding metal formed on an uppermost metal layer of the lower chip. For example, when the bonding metal includes copper (Cu), the bonding method may include a Cu-to-Cu bonding method, and the bonding metal may also include aluminum (Al) or tungsten (W).

Each of the periphery circuit region PERI and the cell region CELL of the semiconductor device 400 may include an external pad bonding area PA, a word line bonding area WLBA, and a bit line bonding area BLBA.

The periphery circuit region PERI may include a first substrate 210, an interlayer insulating layer 215, a plurality of circuit elements 220a, 220b, and 220c formed on the first substrate 210, and first metal layers 230a, 230b, and 230c respectively connected to the plurality of circuit elements 220a, 220b, and 220c, and second metal layers 240a, 240b, and 240c respectively formed on the first metal layers 230a, 230b, and 230c. In an example embodiment, the first metal layers 230a, 230b, and 230c may include W having a relatively high electrical specific resistance, and the second metal layers 240a, 240b, and 240c may include Cu having a relatively low electrical specific resistance.

In inventive concepts, only the first metal layers 230a, 230b, and 230c and the second metal layers 240a, 240b, and 240c are illustrated and described, but example embodiments are not limited thereto, and at least one metal layer may be further formed on the second metal layers 240a, 240b, and 240c. At least some of the one or more metal layers formed on the second metal layers 240a, 240b, and 240c may include Al or the like having a lower electrical specific resistance than Cu, which forms the second metal layers 240a, 240b, and 240c.

The interlayer insulating layer 215 may be arranged on the first substrate 210 to cover the plurality of circuit elements 220a, 220b, and 220c, the first metal layers 230a, 230b, and 230c, and the second metal layers 240a, 240b, and 240c, and may include an insulating material such as silicon oxide and silicon nitride.

Lower bonding metals 271b and 272b may be formed on the second metal layer 240b in the word line bonding area WLBA. In the word line bonding area WLBA, the lower bonding metals 271b and 272b in the periphery circuit region PERI may be electrically connected to upper bonding metals 371b and 372b in the cell region CELL by using a bonding method, and the lower bonding metals 271b and 272b and the upper bonding metals 371b and 372b may include Al, Cu, or W, etc.

The cell region CELL may provide at least one memory block. The cell region CELL may include a second substrate 310 and a common source line 320. Under the second substrate 310, a plurality of word lines 331 through 338 (or comprehensively 330) may be stacked in the vertical direction (Z direction) perpendicular to a lower surface of the second substrate 310. String selection lines and ground selection lines may be arranged on and under the word lines 330, respectively, and the plurality of word lines 330 may be arranged between the string selection lines and the ground selection line.

In the bit line bonding area BLBA, a channel structure CHS may extend in the vertical direction (Z direction) perpendicular to the lower surface of the second substrate 310, and penetrate the word lines 330, the string selection lines, and the ground selection line. The channel structure CHS may include a data storage layer, a channel layer, a filled insulating layer, or the like, and the channel layer may be electrically connected to a bit line contact 350c and upper and bit lines 360cH and 360cL. For example, the bit lines 360cH and 360cL may include an upper bit line 360cH and a lower bit line 360cL, respectively. In FIG. 14, it is illustrated that the bit line contact 350c includes an upper bit line contact connected to the upper bit line 360cH, but example embodiments are not limited thereto, and the semiconductor device 400 may further include a lower bit line contact connected to the lower bit line 360cL. In an example embodiment, the bit lines 360cH and 360cL may be formed in a similar shape to the plurality of bit lines 180 and 180a described with reference to FIGS. 3 through 13.

In the example embodiment illustrated in FIG. 14, an area, in which the channel structure CHS and the bit lines 360cH and 360cL, or the like are arranged, may be defined as the bit line bonding area BLBA. The bit lines 360cH and 360cL may be electrically connected to circuit elements 220c providing a page buffer 393 in the periphery circuit region PERI, in the bit line bonding area BLBA. For example, the bit line 360cH and 360cL may be connected to upper bonding metals 371c and 372c in the cell region CELL, respectively, and the upper bonding metals 371c and 372c may be connected to lower bonding metals 271c and 272c connected to the circuit elements 220c of the page buffer 393, respectively.

In the word line bonding area WLBA, the word lines 330 may extend in parallel with the lower surface of the second substrate 310 in the first horizontal direction (X direction), and may be connected to a plurality of cell contact plugs 341 through 347 (or comprehensively 340). The word lines 330 and the cell contact plugs 340 may be connected to each other on pads, which are provided by extending at least some of the word lines 330 to different lengths from each other in the first horizontal direction (X direction). Metal contact layers 350b and metal distribution layers 360b may be sequentially connected to lower surfaces of the cell contact plugs 340 respectively connected to the word lines 330. In the word line bonding area WLBA, the cell contact plugs 340 may be connected to the periphery circuit region PERI via the upper bonding metals 371b and 372b in the cell region CELL and the lower bonding metals 271b and 272b in the periphery circuit region PERI.

The cell contact plugs 340 may be electrically connected to the circuit elements 220b forming a row decoder 394 in the periphery circuit region PERI. In an example embodiment, an operating voltage of the circuit elements 220b forming the row decoder 394 may be different from an operating voltage of the circuit elements 220c forming the page buffer 393. For example, the operating voltage of the circuit elements 220c forming the page buffer 393 may be greater than the operating voltage of the circuit elements 220b forming the row decoder 394.

A common source line contact plug 380 may be arranged in the external pad bonding area PA. The common source line contact plug 380 may include a conductive material such as a metal, a metal compound, and polysilicon, and may be electrically connected to the common source line 320. A metal contact layer 350a and a metal distribution layer 360a may be sequentially stacked under the common source line contact plug 380. For example, an area, in which the common source line contact plug 380, the metal contact layer 350a, and the metal distribution layer 360a are arranged, may be defined as the external pad bonding area PA.

On the other hand, first and second I/O pads 205 and 305 may be arranged in the external pad bonding area PA. Referring to FIG. 14, a lower insulating layer 201 covering a lower surface of the first substrate 210 may be formed under the first substrate 210, and the first I/O pad 205 may be formed under the lower insulating layer 201. The first I/O pad 205 may be connected to at least one of the plurality of circuit elements 220a, 220b, and 220c in the periphery circuit region PERI via a first I/O contact plug 203, and may be separated from the first substrate 210 by the lower insulating layer 201. In addition, a side insulating layer may be arranged between the first I/O contact plug 203 and the first substrate 210, and may electrically separate the first I/O contact plug 203 from the first substrate 210.

Referring to FIG. 14, an upper insulating layer 301 covering an upper surface of the second substrate 310 may be formed on the second substrate 310, and the second I/O pad 305 may be arranged on the upper insulating layer 301. The second I/O pad 305 may be connected to at least one of the plurality of circuit elements 220a, 220b, and 220c arranged in the periphery circuit region PERI via a second I/O contact plug 303. In an example embodiment, the second I/O pad 305 may be electrically connected to the circuit element 220a.

According to embodiments, the second substrate 310, the common source line 320, or the like may not be arranged in an area, in which the second I/O contact plug 303 is arranged. In addition, the second I/O pad 305 may not overlap the word lines 330 in the vertical direction (Z direction). Referring to FIG. 14, the second I/O contact plug 303 may be separated from the second substrate 310 in a direction in parallel with the upper surface of the second substrate 310, may penetrate an interlayer insulating layer 315 in the cell region CELL, and then, may be connected to the second I/O pad 305.

According to example embodiments, the first I/O pad 205 and the second I/O pad 305 may be selectively formed. For example, the semiconductor device 400 may include only the first I/O pad 205 arranged on the first substrate 210, or may include only the second I/O pad 305 arranged on the second substrate 310. Alternatively, the semiconductor device 400 may also include both the first I/O pad 205 and the second I/O pad 305.

In each of the outer pad bonding area PA and the bit line bonding area BLBA, which are included in each of the cell region CELL and the periphery circuit region PERI, a metal pattern of the uppermost metal layer may be arranged as a dummy pattern, or the uppermost metal layer may be empty.

In the external pad bonding area PA of the semiconductor device 400, a lower metal pattern 273a having the same shape as an upper metal pattern 372a in the cell region CELL may be formed on the uppermost metal layer in the periphery circuit region PERI, in response to the upper metal pattern 372a formed on the uppermost metal layer in the cell region CELL. The lower metal pattern 273a formed on the uppermost metal layer in the periphery circuit region PERI may not be connected to a separate contact in the periphery circuit region PERI. Similar to this case, in response to the lower metal pattern 273a formed on the uppermost metal layer of the periphery circuit region PERI in the external pad bonding area PA, the upper metal pattern 372a having the same shape as the lower metal pattern 273a of the periphery circuit region PERI may also be formed on the uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the periphery circuit region PERI may be electrically connected to the upper bonding metals 371b and 372b of the cell region CELL by using a bonding method, respectively.

In addition, in the bit line bonding area BLBA, in response to a lower metal pattern 252 formed on the uppermost metal layer in the periphery circuit region PERI, an upper metal pattern 392 having the same shape as the lower metal pattern 252 in the periphery circuit region PERI may be formed on the uppermost metal layer of the cell region CELL. A contact may not be formed on the upper metal pattern 392, which is formed on the uppermost metal layer in the cell region CELL.

Figure 15:
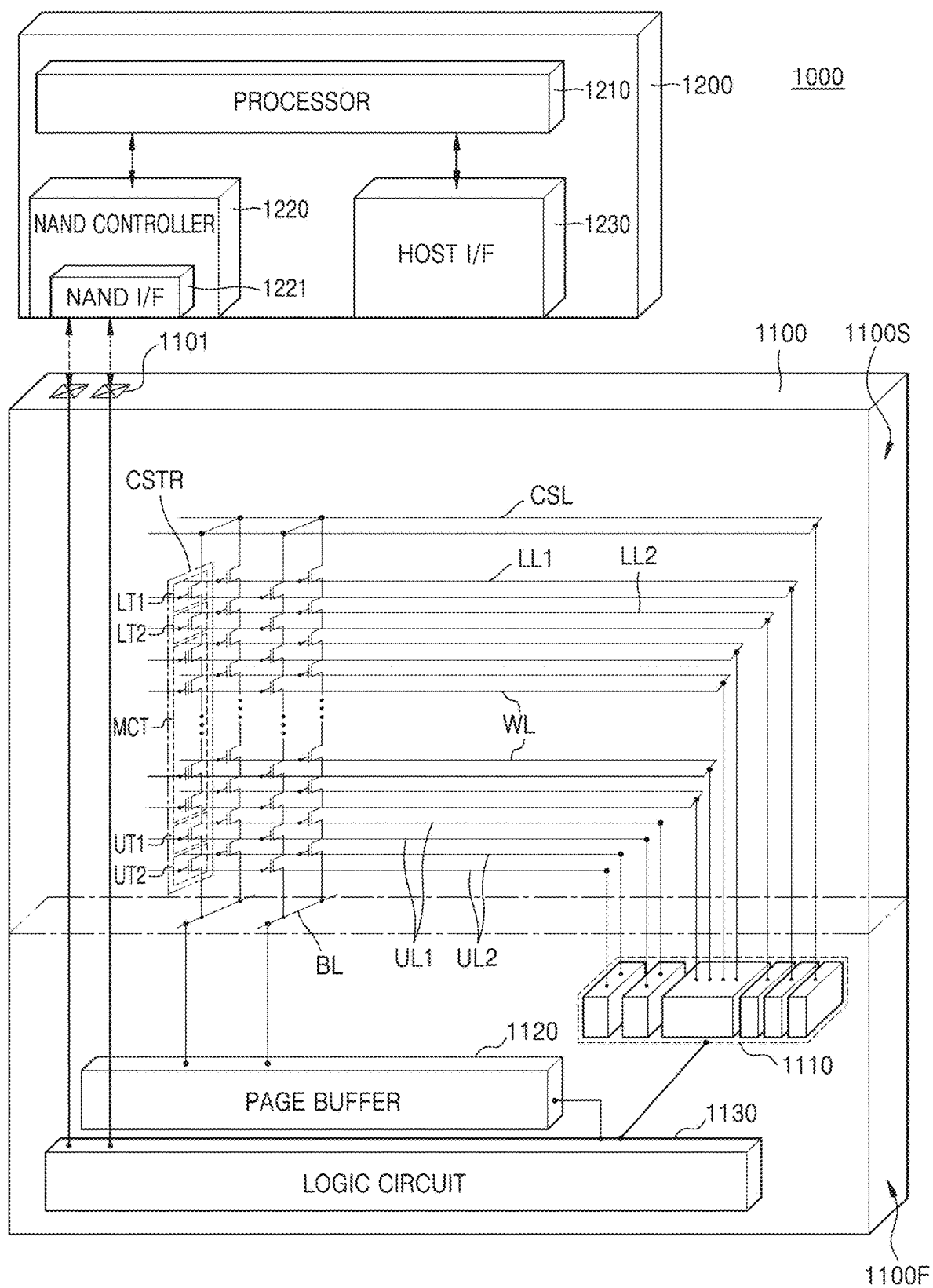
FIG. 15 is a schematic diagram of an electronic system including a semiconductor device, according to an embodiment.

FIG. 15 is a schematic diagram of an electronic system 1000 including a semiconductor device 1100, according to an example embodiment.

Referring to FIG. 15, The electronic system 1000 may include one or more semiconductor devices 1100, and a memory controller 1200 electrically connected to the semiconductor device 1100. The electronic system 1000 may, for example, include a solid state drive (SSD) device including at least one semiconductor device 1100, universal serial bus (USB), a computing system, a medical device, or a communication device.

The semiconductor device 1100 may include a non-volatile semiconductor device, and for example, the semiconductor device 1100 may include a NAND flash semiconductor device including one of the semiconductor devices 10, 100, 100A, 200, 300, 400 described with reference to FIGS. 1 through 14. The semiconductor device 1100 may include a first structure 1100F and a second structure 1100S on the first structure 1100F. The first structure 1100F may include a periphery circuit structure including a row decoder 1110, a page buffer 1120, and a logic circuit 1130.

The second structure 1100S may have a memory cell structure including the bit line BL, the common source line CSL, the plurality of word lines WL, a first gate upper line UL1 and a second gate upper line UL2, a first ground selection line LL1 and a second ground selection line LL2, and a plurality of memory cell strings CSTR between the bit line BL and the common source line CSL.

In the second structure 1100S, each of the plurality of memory cell strings CSTR may include ground selection transistors LT1 and LT2 adjacent to the common source line CSL, and string selection transistors UT1 and UT2 adjacent to the bit line BL, and a plurality of memory cell transistors MCT arranged between the ground selection transistors LT1 and LT2 and the string selection transistors UT1 and UT2. The number of the ground selection transistors LT1 and LT2 and the number of the string selection transistors UT1 and UT2 may be variously modified according to embodiments.

In example embodiments, the plurality of ground selection lines LL1 and LL2 may be connected to the ground selection transistors LT1 and LT2, respectively. The word line WL may be connected to a gate electrode of the memory cell transistor MCT. The plurality of string selection lines UL1 and UL2 may be connected to gate electrodes of string selection transistors UT1 and UT2, respectively.

The common source line CSL, the plurality of ground selection lines LL1 and LL2, the plurality of word lines WL, and the plurality of string selection lines UL1 and UL2 may be connected to the row decoder 1110. A plurality of bit lines BL may be electrically connected to the page buffer 1120.

The semiconductor device 1100 may communicate with a memory controller 1200 via an I/O pad 1101 electrically connected to the logic circuit 1130. The I/O pad 1101 may be electrically connected to the logic circuit 1130.

The memory controller 1200 may include a processor 1210, a NAND controller 1220, and a host interface 1230. In some embodiments, the electronic system 1000 may include a plurality of semiconductor devices 1100, and in this case, the memory controller 1200 may control the plurality of semiconductor devices 1100.

The processor 1210 may control the overall operation of the electronic system 1000 including the memory controller 1200. The processor 1210 may operate according to certain firmware, and may access the semiconductor device 1100 by controlling the NAND controller 1220. The NAND controller 1220 may include a NAND interface 1221, which processes communication with the semiconductor device 1100. Via the NAND interface 1221, a control command for controlling the semiconductor device 1100, data to be written to the plurality of memory cell transistors MCT of the semiconductor device 1100, data to be read from the plurality of memory cell transistors MCT of the semiconductor device 1100, or the like may be transmitted. The host interface 1230 may provide a communication function between the electronic system 1000 and an external host. When a control command is received from the external host via the host interface 1230, the processor 1210 may control the semiconductor device 1100 in response to the control command.

FIG. 16 is a schematic perspective view of an electronic system 2000 including a semiconductor device, according to an example embodiment.

Referring to FIG. 16, the electronic system 2000 according to an example embodiment may include a main substrate 2001, a controller 2002 mounted on the main substrate 2001, one or more semiconductor packages 2003, and a dynamic random access memory (DRAM) 2004. The semiconductor package 2003 and the DRAM 2004 may be connected to the controller 2002 by a plurality of distribution patterns 2005 formed on the main substrate 2001.

The main substrate 2001 may include a connector 2006 including a plurality of pins coupled with the external host. The number and an arrangement of the plurality of pins in the connector 2006 may vary according to a communication interface between the electronic system 2000 and the external host. In example embodiments, the electronic system 2000 may communicate with the external host according to any one of interfaces such as USB, peripheral component interconnect (PCI) express (PCI-E), serial advanced technology attachment (SATA), and M-Phy for a universal flash storage (UFS). In example embodiments, the electronic system 2000 may be operated by power supplied by the external host via the connector 2006. The electronic system 2000 may also further include a power management integrated circuit (PMIC), which distributes power supplied by the external host to the memory controller 2002 and the semiconductor package 2003.

The memory controller 2002 may write data to the semiconductor package 2003, or read data from the semiconductor package 2003, and may improve an operation speed of the electronic system 2000.

The DRAM 2004 may include a buffer memory for reducing a speed difference between the semiconductor package 2003, which is a data storage space, and the external host. The DRAM 2004 included in the electronic system 2000 may also operate as a kind of cache memory, and may also provide a space for temporarily storing data in a control operation on the semiconductor package 2003. When the DRAM 2004 is included in the electronic system 2000, the memory controller 2002 may further include a DRAM controller for controlling the DRAM 2004 in addition to the NAND controller for controlling the semiconductor package 2003.

The semiconductor package 2003 may include a first semiconductor package 2003a and a second semiconductor package 2003b, which are apart from each other. Each of the first and second semiconductor packages 2003a and 2003b may include a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 arranged on a lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400 on the package substrate 2100.

The package substrate 2100 may include a printed circuit board including a plurality of package upper pads 2130. Each of the plurality of semiconductor chips 2200 may include an I/O pad 2210. The I/O pad 2210 may correspond to the I/O pad 1101 in FIG. 15. Each of the plurality of semiconductor chips 2200 may include at least one of the semiconductor devices 10, 100, 100A, 200, 300, and 400 described with reference to FIGS. 1 through 14.

In example embodiments, the connection structure 2400 may include a bonding wire electrically connecting the I/O pad 2210 to the package upper pad 2130. Accordingly, in the first and second semiconductor packages 2003a and 2003b, the plurality of semiconductor chips 2200 may be electrically connected to each other by using a bonding wire method, and may be electrically connected to the package upper pad 2130 of the package substrate 2100. According to example embodiments, in the first and second semiconductor packages 2003a and 2003b, the plurality of semiconductor chips 2200 may also be electrically connected to each other by a connection structure including through silicon vias TSV, instead of the connection structure 2400 of a bonding wire method.

In example embodiments, the memory controller 2002 and the plurality of semiconductor chips 2200 may also be included in one package. In an example embodiment, the memory controller 2002 and the plurality of semiconductor chips 2200 may be mounted on an interposer substrate discretely different from the main substrate 2001, and the memory controller 2002 and the plurality of semiconductor chips 2200 may also be connected to each other by distribution formed on the interposer substrate.

Figure 17:
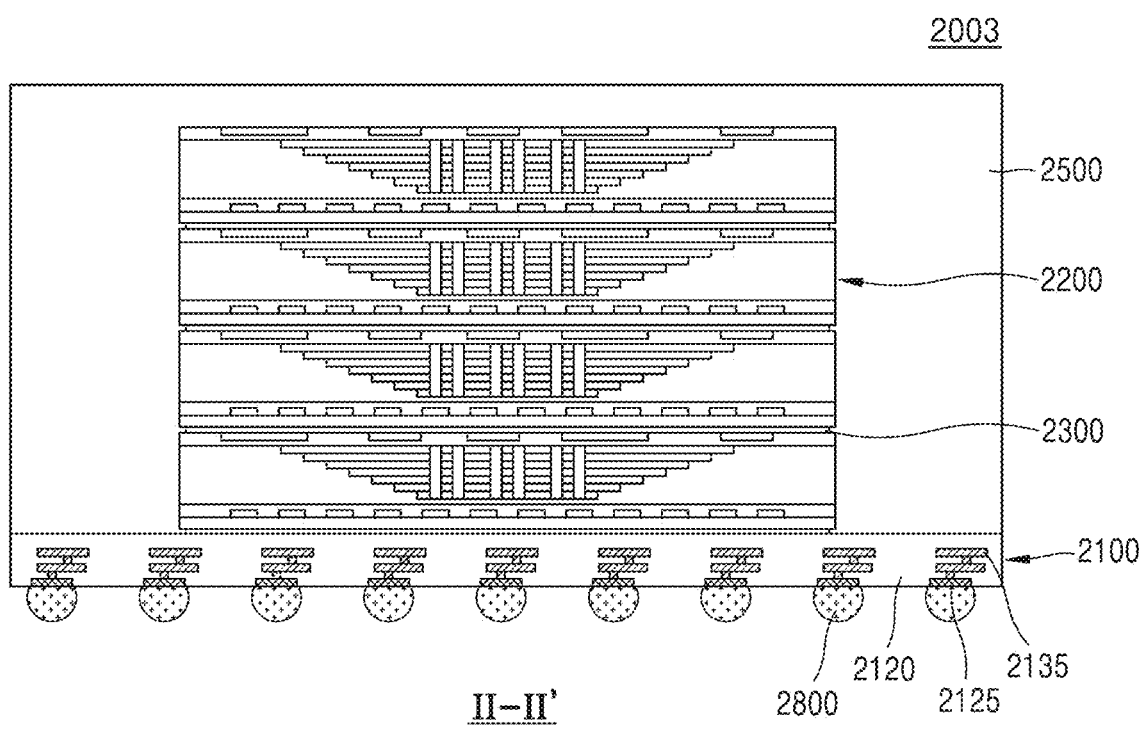
FIG. 17 is a schematic cross-sectional view of a semiconductor package according to an example embodiment.

FIG. 17 is a schematic cross-sectional view of a semiconductor package 2003 according to an example embodiment.

Referring to FIG. 17, in the semiconductor package 2003, the package substrate 2100 may include a printed circuit board. The package substrate 2100 may include a package substrate body 2120, the plurality of package upper pads 2130 (refer to FIG. 16) arranged on an upper surface of the package substrate body 2120, a plurality of lower pads 2125 arranged on a lower surface of the package substrate body 2120 or exposed via the lower surface thereof, and a plurality of internal distribution 2135 electrically connecting the plurality of package upper pads 2130 (refer to FIG. 16) to the plurality of lower pads 2125 in the package substrate body 2120. As illustrated in FIG. 17, the plurality of package upper pads 2130 may be electrically connected to a plurality of connection structure 2400. As illustrated in FIG. 17, the plurality of lower pads 2125 may be connected to the plurality of distribution patterns 2005 on the main substrate 2001 of the electronic system 2000 illustrated in FIG. 18 via a plurality of conductive bumps 2800. Each of the plurality of semiconductor chips 2200 may include at least one of the semiconductor devices 10, 100, 100A, 200, 300, and 400 described with reference to FIGS. 1 through 14.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts has been particularly shown and described with reference to embodiments thereof, it will be understood that various changes in form and details may be made therein without departing from the spirit and scope of the following claims.

What is claimed is:

1. A semiconductor device comprising:
a plurality of gate electrodes apart from each other in a vertical direction on a substrate;
a plurality of channel structures penetrating the plurality of gate electrodes and extending in the vertical direction; and
a plurality of bit lines arranged on the plurality of channel structures and connected to the plurality of channel structures,
the plurality of bit lines including a plurality of lower bit lines and a plurality of upper bit lines at different vertical levels from each other to constitute at least two layers,
the plurality of upper bit lines being spaced apart from each other in a first horizontal direction and extending in parallel with each other in a second horizontal direction,
the second horizontal direction being perpendicular to the first horizontal direction,
each of the plurality of lower bit lines including a first lower segment extending in the second horizontal direction, a second lower segment apart from the first lower segment in the first horizontal direction and extending in the second horizontal direction, and a first lower bending portion connecting the first lower segment to the second lower segment,
the first lower bending portion extending at an inclination angle with respect to the second horizontal direction, and
two adjacent lower bit lines, among the plurality of lower bit lines, defining a lower expansion space between the first lower bending portion of a first one of the two adjacent lower bit lines and the first lower bending portion of a second one of the two adjacent lower bit lines.

2. The semiconductor device of claim 1, further comprising:
a plurality of bit line contacts between the plurality of channel structures and the plurality of bit lines, wherein
the plurality of bit line contacts include a plurality of lower bit line contacts connected to the plurality of lower bit lines and a plurality of upper bit line contacts connected to the plurality of upper bit lines,
the first lower bending portion in each of the plurality of lower bit lines provides a plurality of first lower bending portions,
the plurality of lower bit lines define a plurality of lower expansion spaces between adjacent first lower bending portions among the plurality of first lower bending portions,
each of the plurality of upper bit line contacts connects a corresponding one of the plurality of channel structures to a corresponding one of the plurality of upper bit lines via a corresponding lower expansion space among the plurality of lower expansion spaces.

3. The semiconductor device of claim 1, wherein
the first lower segment and the second lower segment in each of the plurality of lower bit lines are arranged at a first pitch in the first horizontal direction,
the plurality of upper bit lines are arranged at a second pitch in the first horizontal direction,
an expansion width is a width of the lower expansion space in the first horizontal direction, and
the expansion width is greater than the first pitch and less than two times the first pitch.

4. The semiconductor device of claim 3, wherein
each of the plurality of lower bit lines includes a bending region at an interface between the first lower bending portion and the first lower segment,
the bending region in the first one of the two adjacent lower bit lines and the bending region in the second one of the two adjacent lower bit lines are apart from each other in the second horizontal direction by a first distance, and
the first distance is greater than the expansion width.

5. The semiconductor device of claim 4,
each of the two adjacent lower bit lines includes a bending part between the first lower segment and the first lower bending portion,
the bending part and the first lower bending portion in the first one of the two adjacent lower bit lines are apart by a second distance in the second horizontal direction, and
the first lower bending portion in the first one of the two adjacent lower bit lines and the bending part in the second one of the two adjacent lower bit lines are apart from each other by a third distance in the second horizontal direction, and
the third distance is greater than the second distance.

6. The semiconductor device of claim 5,
wherein a sum of the second distance and the third distance is equal to the first distance.

7. The semiconductor device of claim 3,
wherein the first pitch and the second pitch have an identical value.

8. The semiconductor device of claim 7, wherein
the plurality of upper bit lines include a first upper bit line and a second upper bit line that are adjacent to each other,
the first upper bit line and the second upper bit line extend along a first extension line and a second extension line,
the first extension line and the second extension line are spaced apart from each other at a distance of the first pitch in the first horizontal direction,
the first extension line and the second extension line extend in the second horizontal direction, and
in one lower bit line of the plurality of lower bit lines, the first lower segment extends along the first extension line, the second lower segment extends along the second extension line, and the first lower bending portion extends from the first extension line to the second extension line.

9. The semiconductor device of claim 1,
wherein the first lower bending portion of the first one of the two adjacent lower bit lines and the first lower bending portion of the second one of the two adjacent lower bit lines are parallel with each other.

10. The semiconductor device of claim 9,
wherein the first lower bending portion has an inclination angle of about 20 degrees to about 70 degrees with respect to the second horizontal direction.

11. The semiconductor device of claim 9, wherein
among the plurality of upper bit lines and the plurality of lower bit lines, some of the plurality of upper bit lines and some of the plurality of lower bit lines constitute one set and are repeated in the first horizontal direction, and
in the one set, a number of the plurality of lower bit lines is less than a number of the plurality of upper bit lines.

12. A semiconductor device comprising:
a gate stack on a substrate and including,
  a plurality of gate electrodes spaced apart from each other in a vertical direction on the substrate,
  a plurality of channel structures penetrating the plurality of gate electrodes and extending in the vertical direction,
  a pair of gate stack separation openings penetrating the plurality of gate electrodes and extending in a first horizontal direction,
  a string selection line cut region penetrating at least one gate electrode, the at least one gate electrode including an uppermost gate electrode among the plurality of gate electrodes, and the string selection line cut region extending in the first horizontal direction between the pair of gate stack separation openings, and
  a plurality of bit lines respectively arranged on the plurality of channel structures, the plurality of bit lines including a plurality of lower bit lines and a plurality of upper bit lines at different vertical levels from each other to constitute at least two layers,
  each of the plurality of lower bit lines including a first lower segment extending in a second horizontal direction, a second lower segment apart from the first lower segment in the first horizontal direction and extending in the second horizontal direction, and a first lower bending portion connecting the first lower segment to the second lower segment and extending at an inclination angle with respect to the second horizontal direction,
  two adjacent lower bit lines, among the plurality of lower bit lines, defining a first lower expansion space between the first lower bending portion of a first one of the two adjacent lower bit lines and the first lower bending portion of a second one of the two adjacent lower bit lines, and
the plurality of upper bit lines extending parallel with each other in the second horizontal direction, the second horizontal direction being perpendicular to the first horizontal direction; and
a plurality of bit line contacts between the plurality of channel structures and the plurality of bit lines, the plurality of bit line contacts including a plurality of lower bit line contacts connected to the plurality of lower bit lines and a plurality of upper bit line contacts connected to the plurality of upper bit lines, wherein
at least some of the plurality of upper bit line contacts connect at least some of the plurality of channel structures to at least some of the plurality of upper bit lines via the first lower expansion space.

13. The semiconductor device of claim 12, wherein
in one gate stack separation opening of the pair of gate stack separation openings and the string selection line cut region, the plurality of upper bit lines extend along a plurality of extension lines, which are arranged at a distance of a first pitch in the first horizontal direction,
the plurality of extension lines extend in the second horizontal direction, and
both ends of each of the plurality of lower bit lines between one gate stack separation opening of the pair of gate stack separation openings and the string selection line cut region are on different extension lines adjacent to each other among the plurality of extension lines.

14. The semiconductor device of claim 13, wherein
the first lower segment of the plurality of lower bit lines and the second lower segment of the plurality of lower bit lines are arranged at the first pitch in the first horizontal direction,
the plurality of upper bit lines are arranged at a second pitch in the first horizontal direction, and
the first pitch and the second pitch have an identical value.

15. The semiconductor device of claim 14, wherein
in the plurality of lower bit lines, the first lower segment and the second lower segment have a first width in the first horizontal direction,
the plurality of upper bit lines have a second width in the first horizontal direction, and
an expansion width is a width of the first lower expansion space in the first horizontal direction, and
the expansion width is equal to a sum of the first pitch and the first width.

16. The semiconductor device of claim 15,
wherein the second width is equal to or greater than the first width.

17. The semiconductor device of claim 15,
wherein a horizontal width of each of the plurality of upper bit line contacts is less than the expansion width.

18. The semiconductor device of claim 12, wherein
each of the plurality of lower bit lines further comprises a second lower bending portion connecting the second lower segment to the first lower segment and extending at an inclination angle with respect to the second horizontal direction,
two nearby lower bit lines, among the plurality of lower bit lines, define a second lower expansion space between a first one of the two nearby lower bit lines, the first lower bending portion of a second one of the two nearby lower bit lines, and the second lower bending portion of the second one of the two nearby lower bit lines, and
at least some other of the plurality of upper bit line contacts connect some other of the plurality of channel structures to some other of the plurality of upper bit lines via the second lower expansion space.

19. The semiconductor device of claim 18,
wherein the plurality of bit lines further comprise a plurality of intermediate bit lines at a vertical level between the plurality of lower bit lines and the plurality of upper bit lines,
wherein the plurality of bit line contacts further comprise a plurality of intermediate bit line contacts connected to the plurality of intermediate bit lines,
wherein each of the plurality of intermediate bit lines comprises a first intermediate segment extending in the second horizontal direction, a second intermediate segment apart from the first intermediate segment in the first horizontal direction and extending in the second horizontal direction, and a first intermediate bending portion connecting the first intermediate segment to the second intermediate segment and extending at an inclination angle with respect to the second horizontal direction,
two adjacent intermediate bit lines, among the plurality of intermediate bit lines, define an intermediate expansion space between the first intermediate bending portion of a first one of the two adjacent intermediate bit lines and the first intermediate bending portion of a second one of the two adjacent intermediate bit lines, and wherein the plurality of upper bit line contacts are arranged in the intermediate expansion space.

20. An electronic system comprising:

a main substrate;

a semiconductor device on the main substrate, the semiconductor device including a plurality of gate electrodes, a plurality of channel structures, a plurality of bit lines arranged on and connected to the plurality of channel structures, a periphery circuit electrically connected to the plurality of gate electrodes and the plurality of bit lines, and an input/output pad electrically connected to the periphery circuit, the plurality of gate electrodes being apart from each other in a vertical direction on the main substrate, the plurality of channel structures penetrating the plurality of gate electrodes and extending in the vertical direction, the plurality of bit lines including a plurality of lower bit lines and a plurality of upper bit lines at different vertical levels from each other to constitute at least two layers, the plurality of upper bit lines being apart from each other in a first horizontal direction and extending in parallel with each other in a second horizontal direction, the second horizontal direction being perpendicular to the first horizontal direction, each of the plurality of lower bit lines including a first lower segment extending in the second horizontal direction, a second lower segment apart from the first lower segment in the first horizontal direction and extending in the second horizontal direction, and a first lower bending portion connecting the first lower segment to the second lower segment, the first lower bending portion extending at an inclination angle with respect to the second horizontal direction, and two adjacent lower bit lines, among the plurality of lower bit lines, defining a lower expansion space between the first lower bending portion of a first one of the two adjacent lower bit lines and the first lower bending portion of a second one of the two adjacent lower bit lines; and a controller electrically connected to the semiconductor device on the main substrate.

* * * * *